(12) United States Patent
Jia et al.

(10) Patent No.: US 10,908,202 B1
(45) Date of Patent: Feb. 2, 2021

(54) HIGH-FREQUENCY FAULT COMPONENT BASED DISTANCE PROTECTION SYSTEM AND METHOD FOR A TRANSMISSION LINE OF A RENEWABLE ENERGY SOURCE SYSTEM

(71) Applicant: NORTH CHINA ELECTRIC POWER UNIVERSITY, Beijing (CN)

(72) Inventors: Ke Jia, Beijing (CN); Tianshu Bi, Beijing (CN); Zhe Yang, Beijing (CN)

(73) Assignee: North China Electric Power University, Beijing (CN)

( * ) Notice: Subject to any disclaimer, the term of this patent is extended or adjusted under 35 U.S.C. 154(b) by 0 days.

(21) Appl. No.: 17/021,298

(22) Filed: Sep. 15, 2020

(51) Int. Cl.
   *G01R 31/08* (2020.01)
   *G01R 31/28* (2006.01)
   *G01R 31/42* (2006.01)
   *H02J 3/38* (2006.01)

(52) U.S. Cl.
   CPC .......... *G01R 31/085* (2013.01); *G01R 31/42* (2013.01); *H02J 3/381* (2013.01); *H02J 2300/24* (2020.01); *H02J 2300/28* (2020.01)

(58) Field of Classification Search
   None
   See application file for complete search history.

(56) References Cited

U.S. PATENT DOCUMENTS

| 10,352,984 | B2* | 7/2019 | Thomas | G01R 31/08 |
| 2014/0336959 | A1* | 11/2014 | Thomas | G01R 31/08 |
| | | | | 702/59 |
| 2017/0110875 | A1* | 4/2017 | Schweitzer, III | H02H 7/22 |
| 2019/0003725 | A1* | 1/2019 | Hourigan | H02M 1/10 |

OTHER PUBLICATIONS

Dash et al, Time-frequency transform approach for protection of parallel transmission lines, Jan. 2007, IET Gener. Transm. Distrib., vol. 1, No. 1, pp. 30-38 (Year: 2007).*
Ngo et al, Analysis of Distance Protection in Low Frequency AC Transmission Systems, 2016, IEEE, pp. 1-5 (Year: 2016).*
Yang, Zhe et al., "High-Frequency Fault Component-Based Distance Protection for Large Renewable Power Plants" IEEE Transactions on Power Elctronics, vol. 35, No. 10, pp. 10352-10362, Oct. 2020.

* cited by examiner

*Primary Examiner* — Jermele M Hollington
(74) *Attorney, Agent, or Firm* — Hunton AK, LLP

(57) ABSTRACT

A distance protection system and method based on a high-frequency fault component is provided for a renewal energy source (RES) system. The voltage drop caused by a fault has a full frequency of components and this can be extracted by a wavelet transform. A frequency selection principle that renders high-frequency impedance models a stable impedance phase angle is determined. On this basis, internal and external faults with respect to a transmission line are determined by comparing the magnitude of a high-frequency operating voltage with the magnitude of a high-frequency voltage at the fault point. This disclosed protection system and method can eliminate the influence of frequency offset and weak feed of the RES system by using high-frequency signals generated by voltage drops at the fault point, and can also tolerate signal noises and fault resistance.

2 Claims, 24 Drawing Sheets

HIGH-FREQUENCY FAULT COMPONENT BASED DISTANCE PROTECTION SYSTEM AND METHOD FOR A TRANSMISSION LINE OF A RENEWABLE ENERGY SOURCE SYSTEM

FIELD OF THE INVENTION

The present disclosure relates generally to fault location and protection of power distribution system, and more particularly, to a high-frequency fault component based distance protection system and method for a transmission line of a renewable energy source system.

BACKGROUND

Large-scale renewable energy sources (RESs) are typically connected to a power grid to alleviate environmental pollution and reduce consumption of fossil energy. Due to technological advancements, photovoltaics (PV) and wind power have become an important part of a power system. RESs are generally connected to a collection system from which the RESs are then connected to a local substation through the high-voltage transmission lines. Also, RESs are connected directly or indirectly through power electronics to the power grid. Its fault characteristics exhibit unstable internal impedance, limited current amplitude, current frequency offset and controlled current phase angle, which are significantly different from those of synchronous generators (SGs). Therefore, this can render considerable challenges to conventional distance protections.

SUMMARY

Aspects of the disclosed technology include high-frequency fault component based distance protection systems and methods for renewable power plants.

Embodiments of the present disclosure provide for a high-frequency fault component based distance protection system for a transmission line of a renewable energy source (RES) system. The RES system comprises: a renewable energy source; a collector bus configured to connect the renewable energy source to a first end of the transmission line, a second end of the transmission line being connected to an alternating current (AC) power grid, wherein the second end of the transmission line is opposite to the first end of the transmission line; a protection relay device disposed between the renewable energy source and the collector bus with a proximity to the collector bus; a first circuit breakers disposed at the first end of the transmission line; and a second circuit breaker disposed at the second end of the transmission line. The high-frequency fault component based distance protection system comprises a controller in signal communication with the RES system. The controller is configured to: sample output voltages and currents of the renewable energy source at the protection relay device; determine whether a fault occurs based on the output voltages and currents; when detecting the fault has occurred at a fault point, apply a wavelet transform to a portion of the output voltages and currents, the portion of the measured output voltages and currents being output voltages and currents within a time window of about 10 ms that includes about 5 ms prior to onset of the fault and about 5 ms after onset of the fault; obtain, from the wavelet transform, high-frequency voltages and high-frequency currents in a selected high-frequency range, the selected high-frequency range having a lower frequency limit and an upper frequency limit of about 3 kHz, wherein high-frequency impedance phase angles of the renewable energy source are stable and are in phase with high-frequency impedance phase angles of the transmission line in the selected high-frequency range; determine a first protection high-frequency impedance value for a first protection distance of the transmission line in the selected high-frequency range, the first protection distance being a length of about 80% to about 85% of an entire length of the transmission line and measured from the first end of the transmission line to the second end of the transmission line; determine a second protection high-frequency impedance value for a second protection distance of the transmission line in the selected high-frequency range, the second protection distance being a remaining length of the entire length of the transmission line; determine a high-frequency line impedance from the fault point to the collector bus, and an equivalent high-frequency impedance of the renewable energy source in the selected high-frequency range; construct a high-frequency fault voltage of the fault point in the selected high-frequency range based on the obtained high-frequency voltages and high-frequency currents at the protection relay device, the high-frequency line impedance from the fault point to the collector bus, and the equivalent high-frequency impedance of the renewable energy source; determine a first high-frequency operating voltage for the first protection distance of the transmission line in the selected high-frequency range, based on the obtained high-frequency voltages and high-frequency currents at the protection relay device and the first protection high-frequency impedance value; determine a second high-frequency operating voltage for the second protection distance of the transmission line protection in the selected high-frequency range, based on the obtained high-frequency voltages and high-frequency currents at the protection relay device and the second protection high-frequency impedance value; compare an amplitude of the high-frequency fault voltage of the fault point with an amplitude of the first high-frequency operating voltage; in response to a determination that the amplitude of the first high-frequency operating voltage is greater than or equal to the amplitude of the high-frequency fault voltage of the fault point, identify the fault as an internal fault occurred in the first protection distance of the transmission line, and transmit a trigger signal to the first circuit breaker to cut off the fault; in response to a determination that the amplitude of the first high-frequency operating voltage is less than the amplitude of the high-frequency fault voltage of the fault point, compare the amplitude of the high-frequency fault voltage of the fault point with an amplitude of the second high-frequency operating voltage; in response to a determination that the amplitude of the second high-frequency operating voltage is less than the amplitude of the high-frequency fault voltage of the fault point, identify the fault as an external fault with respect to the transmission line; in response to a determination that the amplitude of the second high-frequency operating voltage is greater than or equal to the amplitude of the high-frequency fault voltage of the fault point, execute a delay of a specified time period; determine whether the fault is still present after the specified time period; in response to a determination that the fault still exists, identify the fault as an internal fault occurred in the second protection distance of the transmission line, and transmit a trigger signal to the second circuit breaker to cut off the fault; and in response to a determination that the fault does not exist anymore, identify the fault as an external fault with respect to the transmission line.

Embodiments of the present disclosure provide for a high-frequency fault component based distance protection method for a transmission line of a renewable energy source (RES) system. The RES system comprises: a renewable energy source; a collector bus configured to connect the renewable energy source to a first end of the transmission line, a second end of the transmission line being connected to an alternating current (AC) power grid, wherein the second end of the transmission line is opposite to the first end of the transmission line; a protection relay device disposed between the renewable energy source and the collector bus with a proximity to the collector bus; a first circuit breakers disposed at the first end of the transmission line; a second circuit breaker disposed at the second end of the transmission line; and a controller in signal communication with the RES system. The high-frequency fault component based distance protection method comprises: sampling, by the controller, output voltages and currents of the renewable energy source at the protection relay device; determining, by the controller, whether a fault occurs based on the output voltages and currents; when detecting the fault has occurred at a fault point, applying, by the controller, a wavelet transform to a portion of the output voltages and currents, the portion of the measured output voltages and currents being output voltages and currents within a time window of about 10 ms that includes about 5 ms prior to onset of the fault and about 5 ms after onset of the fault; obtaining, by the controller from the wavelet transform, high-frequency voltages and high-frequency currents in a selected high-frequency range, the selected high-frequency range having a lower frequency limit and an upper frequency limit of about 3 kHz, wherein high-frequency impedance phase angles of the renewable energy source are stable and are in phase with high-frequency impedance phase angles of the transmission line in the selected high-frequency range; determining, by the controller, a first protection high-frequency impedance value for a first protection distance of the transmission line in the selected high-frequency range, the first protection distance being a length of about 80% to about 85% of an entire length of the transmission line and measured from the first end of the transmission line to the second end of the transmission line; determining, by the controller, a second protection high-frequency impedance value for a second protection distance of the transmission line in the selected high-frequency range, the second protection distance being a remaining length of the entire length of the transmission line; determining, by the controller, a high-frequency line impedance from the fault point to the collector bus, and an equivalent high-frequency impedance of the renewable energy source in the selected high-frequency range; constructing, by the controller, a high-frequency fault voltage of the fault point in the selected high-frequency range based on the obtained high-frequency voltages and high-frequency currents at the protection relay device, the high-frequency line impedance from the fault point to the collector bus, and the equivalent high-frequency impedance of the renewable energy source; determining, by the controller, a first high-frequency operating voltage for the first protection distance of the transmission line in the selected high-frequency range, based on the obtained high-frequency voltages and high-frequency currents at the protection relay device and the first protection high-frequency impedance value; determining, by the controller, a second high-frequency operating voltage for the second protection distance of the transmission line protection in the selected high-frequency range, based on the obtained high-frequency voltages and high-frequency currents at the protection relay device and the second protection high-frequency impedance value; comparing, by the controller, an amplitude of the high-frequency fault voltage of the fault point with an amplitude of the first high-frequency operating voltage; in response to a determination that the amplitude of the first high-frequency operating voltage is greater than or equal to the amplitude of the high-frequency fault voltage of the fault point, identifying, by the controller, the fault as an internal fault occurred in the first protection distance of the transmission line, and transmitting, by the controller, a trigger signal to the first circuit breaker to cut off the fault; in response to a determination that the amplitude of the first high-frequency operating voltage is less than the amplitude of the high-frequency fault voltage of the fault point, comparing, by the controller, the amplitude of the high-frequency fault voltage of the fault point with an amplitude of the second high-frequency operating voltage; in response to a determination that the amplitude of the second high-frequency operating voltage is less than the amplitude of the high-frequency fault voltage of the fault point, identifying, by the controller, the fault as an external fault with respect to the transmission line; in response to a determination that the amplitude of the second high-frequency operating voltage is greater than or equal to the amplitude of the high-frequency fault voltage of the fault point, executing, by the controller, a delay of a specified time period; determining, by the controller, whether the fault is still present after the specified time period; in response to a determination that the fault still exists, identifying, by the controller, the fault as an internal fault occurred in the second protection distance of the transmission line, and transmitting, by the controller, a trigger signal to the second circuit breaker to cut off the fault; and in response to a determination that the fault does not exist anymore, identifying, by the controller, the fault as an external fault with respect to the transmission line.

Further features of the disclosed systems and methods, and the advantages offered thereby, are explained in greater detail hereinafter with reference to specific example embodiments illustrated in the accompanying drawings.

BRIEF DESCRIPTION OF THE DRAWINGS

In order to facilitate a fuller understanding of the present invention, reference is now made to the attached drawings. The drawings should not be construed as limiting the present invention, but are intended only to illustrate different aspects and embodiments of the invention.

DETAILED DESCRIPTION

Figure 1:
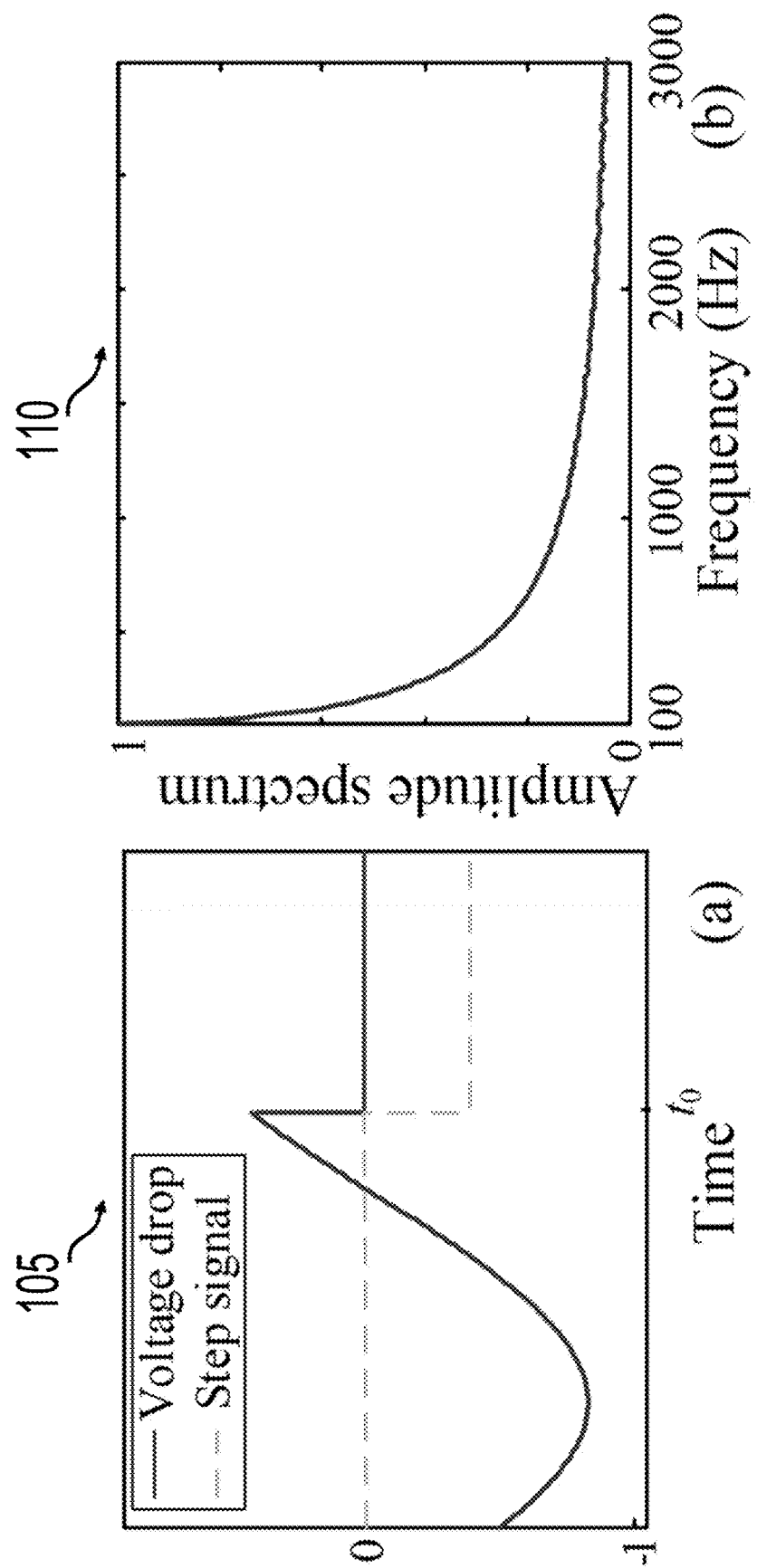
FIG. 1 shows an example unit step signal and its amplitude spectrum according to an embodiment of the present disclosure.

Exemplary embodiments of the invention will now be described in order to illustrate various features of the invention. The embodiments described herein are not intended to be limiting as to the scope of the invention, but rather are intended to provide examples of the components, use, and operation of the invention. The following description of embodiments provides non-limiting representative examples referencing numerals to particularly describe features and teachings of different aspects of the invention. The embodiments described should be recognized as capable of implementation separately, or in combination, with other embodiments from the description of the embodiments. A person of ordinary skill in the art reviewing the description of embodiments should be able to learn and understand the different described aspects of the invention. The description of embodiments should facilitate understanding of the invention to such an extent that other implementations, not specifically covered but within the knowledge of a person of skill in the art having read the description of embodiments, would be understood to be consistent with an application of the invention.

As described, RESs are directly or indirectly connected to a power grid through power electronic devices. The short-circuit current of the RESs exhibits characteristics, such as, limited amplitude, non-power frequency and controlled phase angle, which may lead to the malfunction of the RES-side distance protection on a transmission line. In order to solve such problems, a distance protection system and method based on the high-frequency fault component is provided in this disclosure. The voltage drop caused by a fault has a full frequency component and this can be extracted by a wavelet transform. After that, a high-frequency impedance model of an inverter-interfaced renewable energy generator (IIREG) and a high-frequency impedance model of a doubly-fed induction generator (DFIG) are established. A frequency selection principle that renders the high-frequency impedance models a stable impedance phase angle can be determined. On this basis, internal and external faults with respect to the transmission line can be determined by comparing the magnitude of a high-frequency operating voltage with the magnitude of a high-frequency voltage at the fault point. This method disclosed herein can eliminate the influence of frequency offset and weak feed of the RESs by using high-frequency signals generated by voltage drops at a fault point, and can also tolerate signal noises. Further, due to the large radius of impedance circle at the high-frequency range, this method disclosed herein can be highly capable of withstanding the fault resistance. The experimental results and field-testing data can verify the effectiveness of the method and system disclosed herein.

I. Introduction

The performance of a conventional power frequency distance protection may be affected by the weak feed of RESs. For example, the weak fault current of inverter-interfaced renewable energy generators (IIREGs) can greatly amplify the influence of the fault resistance, so the RES-side distance protection has a high risk of action refusal while the grid-side distance protection is basically unaffected by RESs. For another example, the fault current characteristics of doubly-fed induction generators (DFIGs) are analyzed to find out that they also have a weak-feed effect on the distance protection when the crowbar is not put into operation. There have been some solutions to the above problems. For example, the formula of the new measured impedance can be constructed using the large zero-sequence current for asymmetric grounding faults, which could correctly reflect the distance from the fault point to the relay point, but this is not suitable for phase-to-phase faults. For another example, the weak-feed function of RESs may be eliminated by allowing the circuit breaker on the grid side to trip firstly, but this can increase the fault isolation time. In addition, an adaptive distance protection may also be used to solve this problem. The trip boundary could be adjusted with voltages and current flows of the whole system. For example, the trip boundary can be constructed by an error impedance calculated with the bus voltage, current and the capacity of a power plant. However, these above-mentioned protection principles have higher requirements for the communication system.

Further, the frequency offset of the DFIG fault current also has an important impact on the performance of the power frequency distance protection when the crowbar is put into operation. The unstable measurement trajectory can cause the power frequency distance protection to reject operation. For example, the power frequency distance protection can fail to be a backup protection of a subordinate line due to the changing measurement trajectory. A corresponding solution using modified permissive overreach transfer trip (POTT) scheme may be able to solve this problem. For example, a distance protection method may be based on the parameter identification, mainly using the R-L model of the synchronization system. Considering that the steady-state stator voltage and current components of the DFIG do not conform to the R-L model, the distance protection based on the R-L model may be improved by filtering out the power frequency components. However, for the above methods based on the time domain, the first order partial derivative is susceptible to higher harmonics and the protection performance is slightly poor. In addition, a power frequency variation distance protection may refuse to operate due to the variable impedance angle of RESs. Unlike SGs in which the impedance angle is stable at about 90°, the internal impedance angle of RESs varies widely and may be capacitive, so the power frequency variation distance protection can lose its physical meaning. Therefore, there is a need for a new distance protection to overcome these problems.

In this disclosure, a high-frequency fault component based distance protection is disclosed to solve the problems associated with the power frequency distance protection and the power frequency variation component distance protection, for example, having a high risk of action refusal on the RES side. Advantages of the method disclosed herein may include, but not limited to, just using data of about 10 ms which can include 5 ms prior to the onset of a fault and 5 ms after the onset of the fault, operating with a high speed, being immune to control strategies of IIREGs and frequency offset of the DFIG fault, and tolerating a large fault resistance and some noises. These advantages can be verified by the simulations and experiments performed on the real time digital simulator (RTDS) platform and by field-testing dada.

II. High-Frequency Impedance Model of Res

A. Generation of the High-frequency Signals

When a fault occurs on an outgoing transmission line, the voltage drop at the fault point is like a unit step signal, as shown in diagram 105 in FIG. 1. The step signal may have full frequency domain information after Laplace transform, as shown in diagram 110 in FIG. 1. As can be seen in the diagram 110, the spectral energy gradually decreases as the frequency increases. If the voltage happens to be around zero when a fault occurs, there will be no high-frequency components. However, most faults occur near the peak value of the voltage.

In this disclosure, the wavelet transform is used to transform signals from the time domain to the frequency domain, and to extract the high-frequency voltage signals and the high-frequency current signals in the transient process. The signal extraction may only need a data window of about 10 ms including about 5 ms prior to the onset of a fault and about 5 ms after the onset of the fault, so it can operate with a high speed.

B. High Frequency Impedance Model of IIREG

Figure 2:
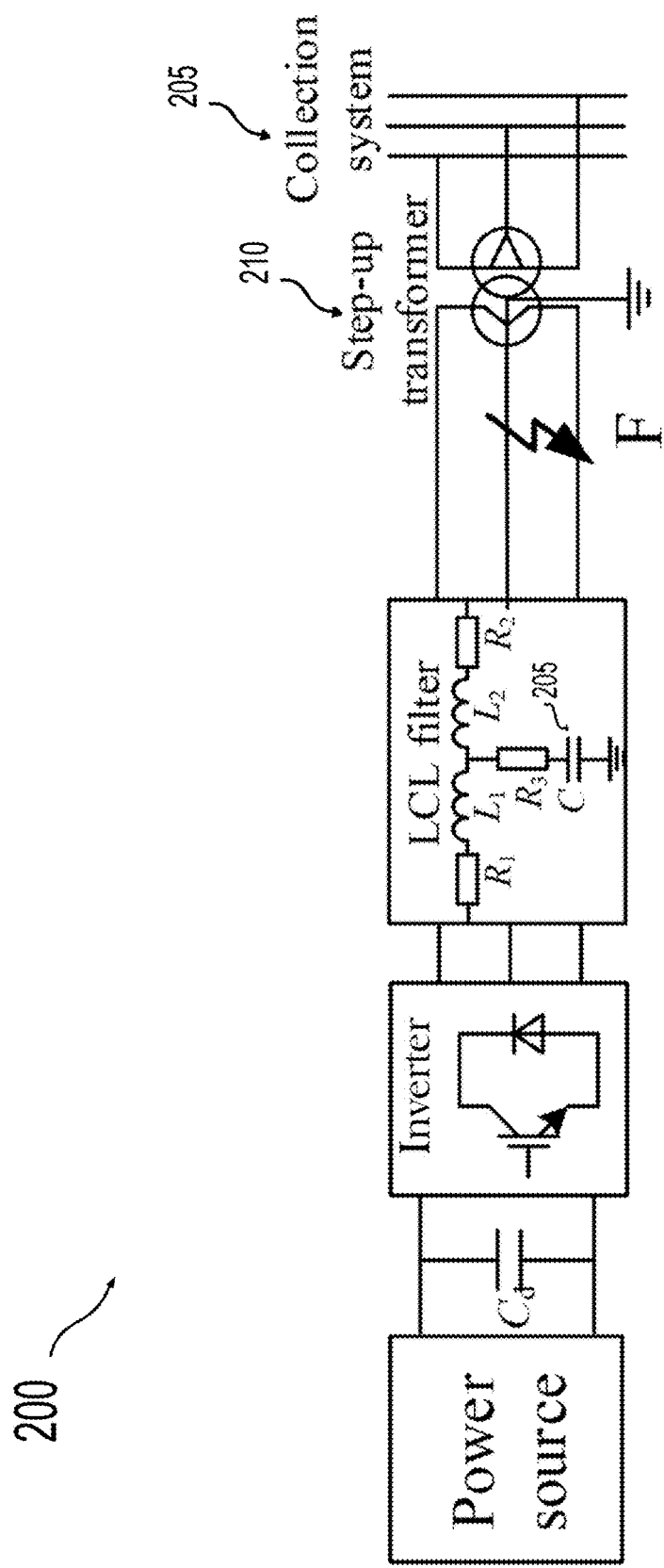
FIG. 2 shows an example topological diagram of an inverter-interfaced renewable energy generators (IIREG) according to an embodiment of the present disclosure.

IIREGs mainly include photovoltaic sources (PVs) and permanent magnet synchronous generators (PMSGs), which may be directly connected to a power grid through inverters. An LCL filter may be installed at the outlet of the inverter. An example topological diagram 200 of an IIREG is shown in FIG. 2.

Figure 3:
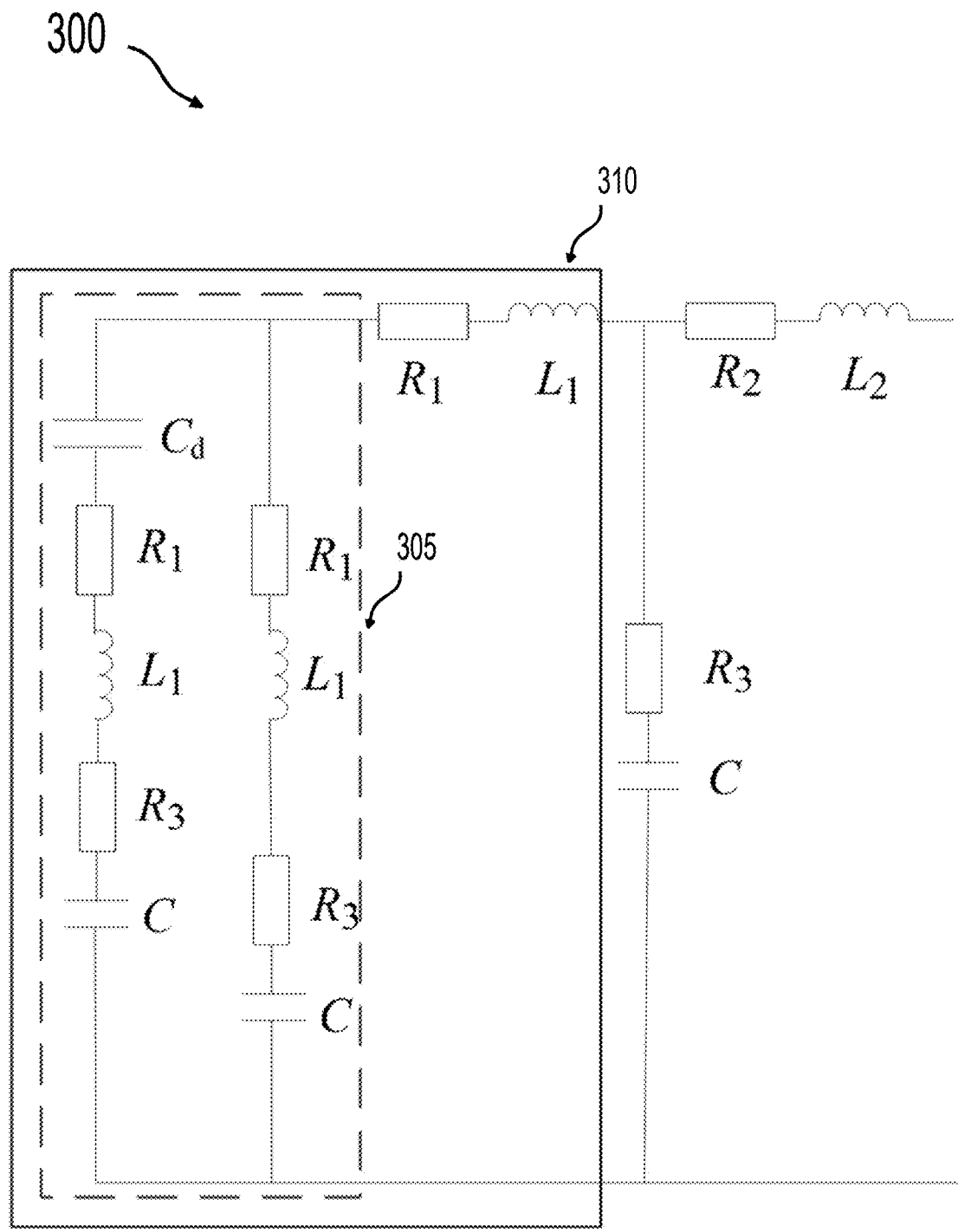
FIG. 3 shows an example IIREG high-frequency impedance structure or model according to an embodiment of the present disclosure.

The IIREG may have four high-frequency impedance structures under different switching states for a single-phase grounding fault. An example impedance structure 300 of the impedance structures is shown in FIG. 3. For the other three impedance structures, only the part inside the dotted line frame 305 is different When the capacitive reactance of the LCL filter capacitor C 205 is less than one tenth of the inductive reactance of $L_1$, the part inside the solid line frame 310 can be ignored, and the four impedance structures can thus be unified as an RLC series circuit. In this case, a selected frequency should satisfy equation (1):

$$f > \sqrt{\frac{10}{4\pi^2 L_1 C}} \tag{1}$$

In addition, equation (2) should also be met to ensure the unified impedance model RLC has a stable impedance angle at around 90°:

$$2\pi f L_2 - \frac{1}{2\pi f C} > R \tan 60° \tag{2}$$

Based on the equations (1) and (2), a lower limit of the selected frequency can be determined. In addition, the selected frequency is preferably below 3 kHz. The reasons for the selected frequency being preferably less than 3 KHz may include: a good signal-to-noise ratio (SNR) can be obtained; the required ability of the measurement units and the computation capability of the data processing boards can be satisfied within 3 KHz; the influence of parasitic capacitance can be neglected within the frequency range of 3 kHz; and the bandwidth of the current loop is usually below 3 kHz. Thus, the effect of control strategies of the RES on the high-frequency signals can be basically ignored.

C. High Frequency Impedance Model of DFIG

Figure 4:
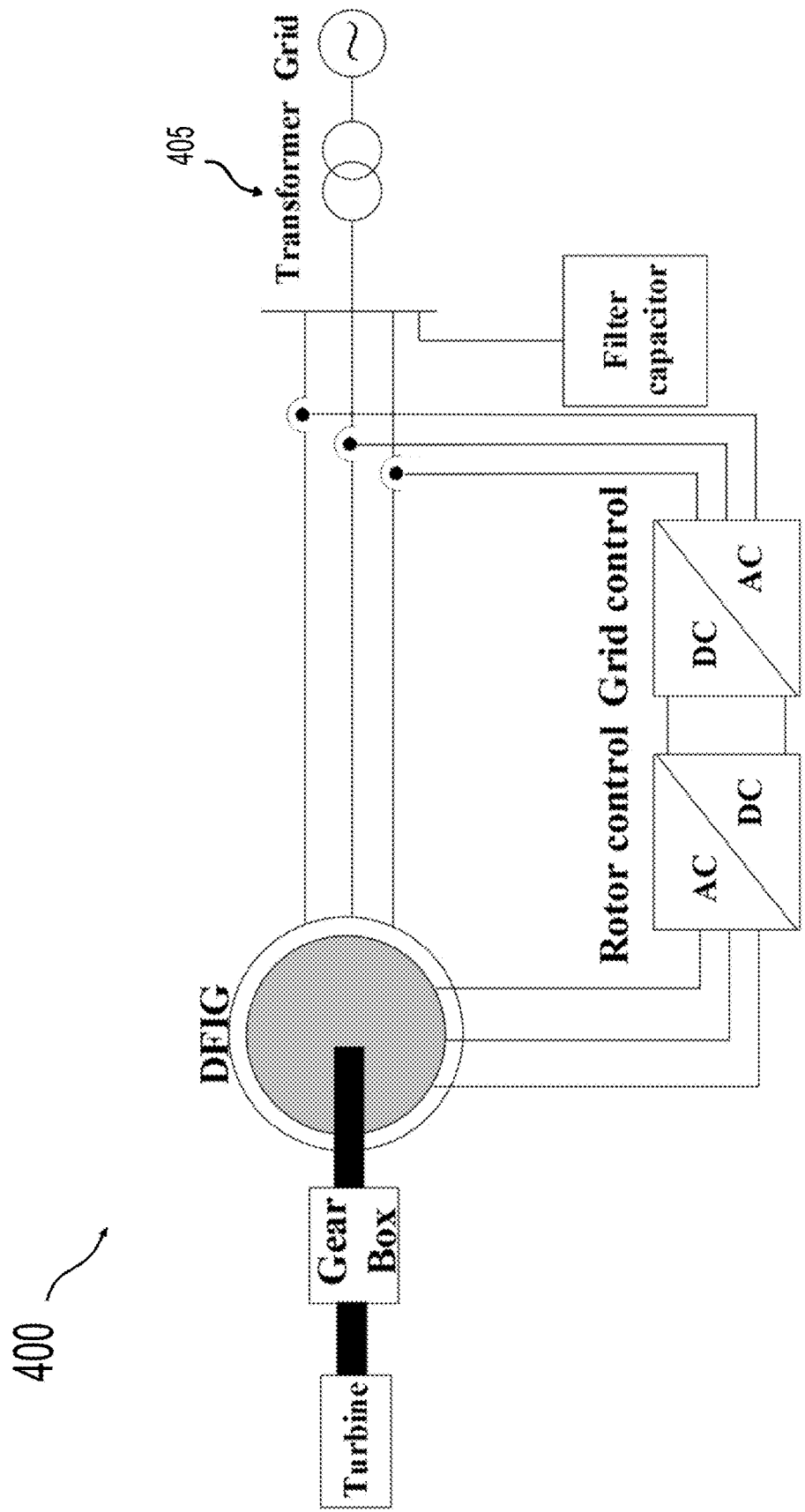
FIG. 4 shows an example topological diagram of a doubly-fed induction generator (DFIG) according to an embodiment of the present disclosure.

An example topological diagram 400 of the DFIG is shown in FIG. 4. It mainly comprises an asynchronous generator and the rotor-side parallel branch.

Figure 5:
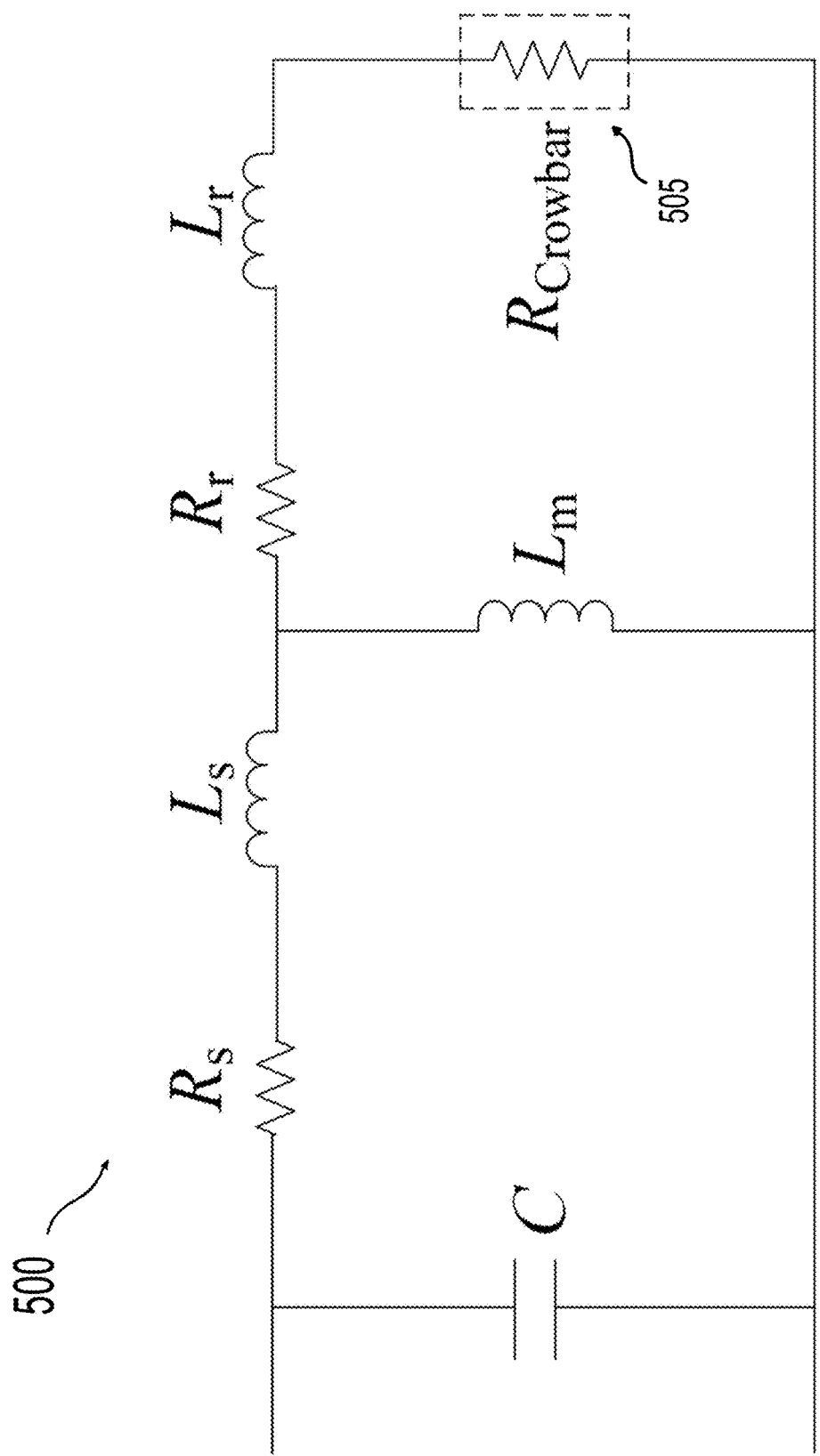
FIG. 5 shows an example high-frequency impedance structure or model of DFIG according to an embodiment of the present disclosure.

The high-frequency impedance model 500 of the DFIG for a single-phase grounding fault is provided as an example high-frequency impedance model of the DFIG, which is composed of an equivalent circuit of the asynchronous generator and a filter capacitor branch, as shown in FIG. 5. $R_s$ and $L_s$ are the stator-side resistance and inductance of the asynchronous generator; $R_r$ and $L_r$ are the rotor-side resistance and inductance of the asynchronous generator; Lm is the excitation reactance of the asynchronous generator; C is the capacitance value of the filter capacitor; and $R_{Crowbar}$ stands for the crowbar resistance. When the crowbar device is not put into operation, the crowbar resistance in the dotted line frame 505 is short-circuited, and thus is not counted into the high-frequency impedance model 500. Once the crowbar device is put into operation, the crowbar resistance is counted into the high-frequency impedance model 500.

When the capacitive reactance of the filter capacitor C is less than one tenth of the inductive reactance of the equivalent circuit of the asynchronous generator connected in parallel, the equivalent branch of the asynchronous generator can be ignored and the high-frequency impedance model 500 in FIG. 5 can be simplified as the filter capacitor C. Therefore, the selected frequency should satisfy equation (3):

$$f > \sqrt{\frac{10}{4\pi^2 (L_s + L_r) C}} \quad (3)$$

However, due to the influence of the main transformer (e.g., the main transformer 620 in FIG. 6), the collection system 205 and the step-up transformer 210, the high-frequency impedance angle measured at the output port of the transmission line still exhibits an inductive state. In order to make this impedance angle greater than 60°, the selected frequency should also satisfy the equation (2). In the equation (2), R is the sum of the resistance of the main transformer, the resistance of the step-up transformer 210, and the resistance of the collection system 205; and $L_2$ is the sum of the inductance of the main transformer, the inductance of the step-up transformer 210 and the inductance of the collection system 205.

III. Distance Protection Based on the High-Frequency Impedance Model

A. Basic Working Principle

The high-frequency impedance model of the IIREG and the DFIG can be equivalent to an RL series circuit in the selected high-frequency range. On this basis, the high-frequency impedance models may exhibit similar phase characteristics as the impedance of the transmission line. Thus, the high-frequency fault component based distance protection disclosed herein can be implemented in the high-frequency network.

Figure 6:
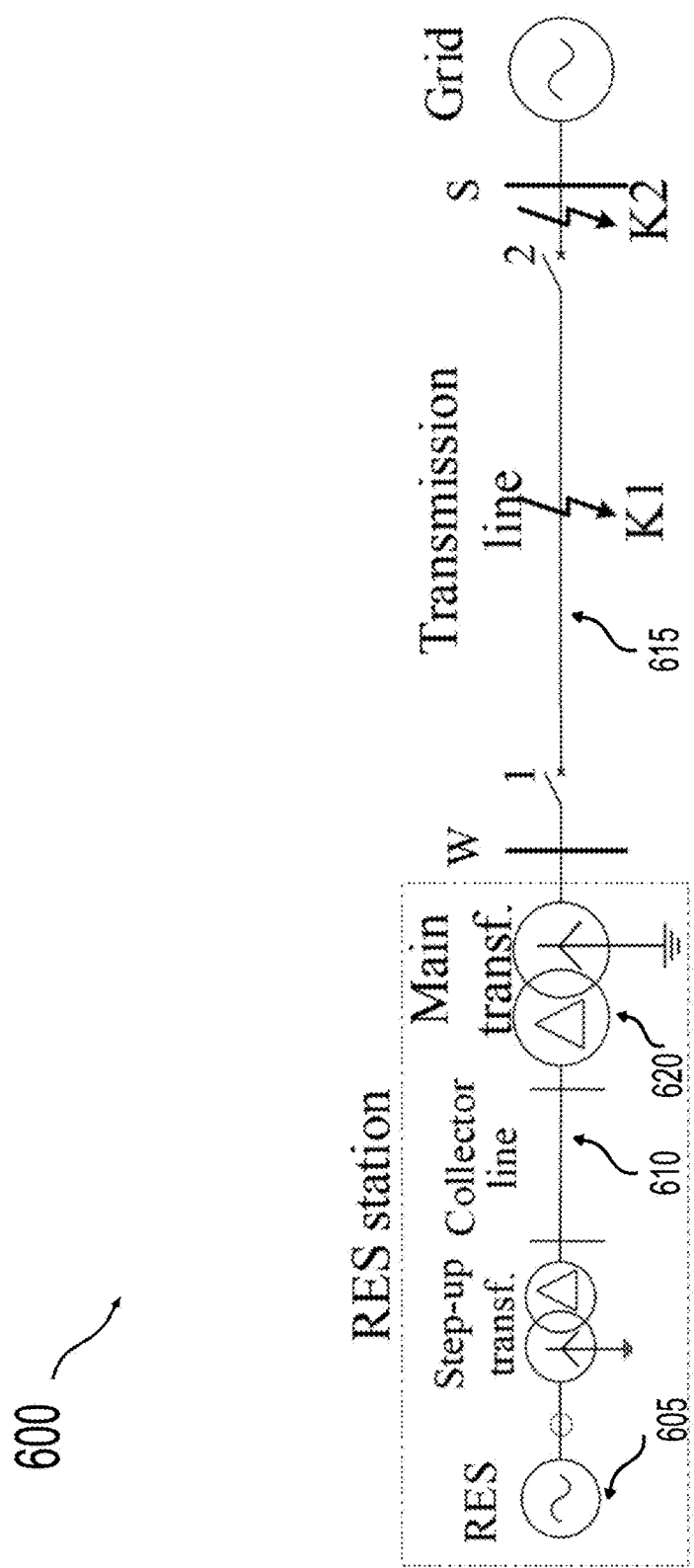
FIG. 6 shows a schematic topological diagram of an example transmission line connected to a RES power plant according to an embodiment of the present disclosure.

A schematic topological diagram 600 of a transmission line connected to a RES power plant is shown in FIG. 6. In the diagram 600, RESs (e.g., RES 605) are connected to a collection system (e.g., collector line 610) and are sent out through a transmission line 615 after the voltage of the RES 605 is boosted by a main transformer 620. In some embodiments, in order to reduce costs, RES power plants may be connected to nearby regional substations, so the length of the outgoing transmission line can be less than 100 km. Under this circumstance, the lumped parameters for the outgoing transmission line can better reflect the outgoing transmission line characteristics.

Figure 7:
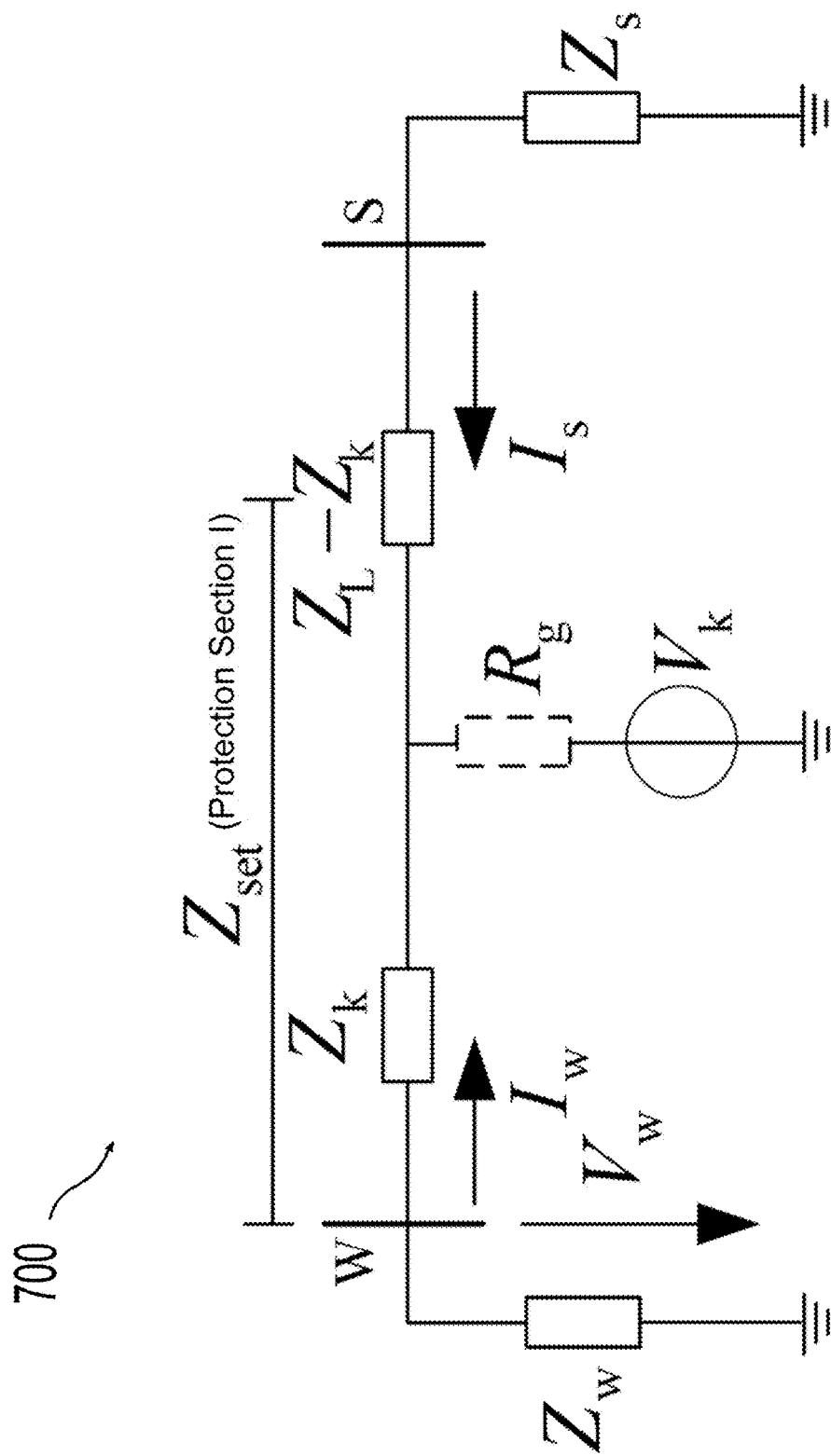
FIG. 7 shows an example high-frequency fault network for a fault located on a transmission line according to an embodiment of the present disclosure.

An example high-frequency fault network 700 for a fault located on the transmission line 615 is shown in FIG. 7. As show in the network 700, $Z_k$ is the high-frequency line impedance from the fault point to the bus W, $Z_L$ is the total high-frequency impedance of the transmission line 615, $Z_w$ and $Z_s$ are the equivalent high-frequency impedance of the RESs (on the W side) and the grid (on the S side), respectively. $V_w$ and $I_w$ are the high-frequency voltage and current measured at the bus W, $V_k$ is the high-frequency voltage source generated by the fault, and $R_g$ is the fault resistance.

According to the reference direction in FIG. 7, the high-frequency current $I_w$ and high-frequency voltage $V_w$ measured at the bus W where a protection relay is disposed can be expressed as equation (40 and equation (5), respectively:

$$I_w = \frac{-V_k}{Z_w + Z_k} \quad (4)$$

$$V_w = -I_w Z_w \quad (5)$$

If $Z_{set}$ is an impedance value set for the distance protection zone I (see FIG. 7), which may be taken as 80%~85% of the high-frequency impedance of the transmission line 615, then the high-frequency working voltage $V_{op}$ can be constructed as equation (6):

$$V_{op} = V_w - I_w Z_{set} = -I_w (Z_w + Z_{set}) \quad (6)$$

The high-frequency voltage $V_k$ at the fault point can be expressed as equation (7):

$$V_k = -I_w (Z_w + Z_k) \quad (7)$$

Figure 8:
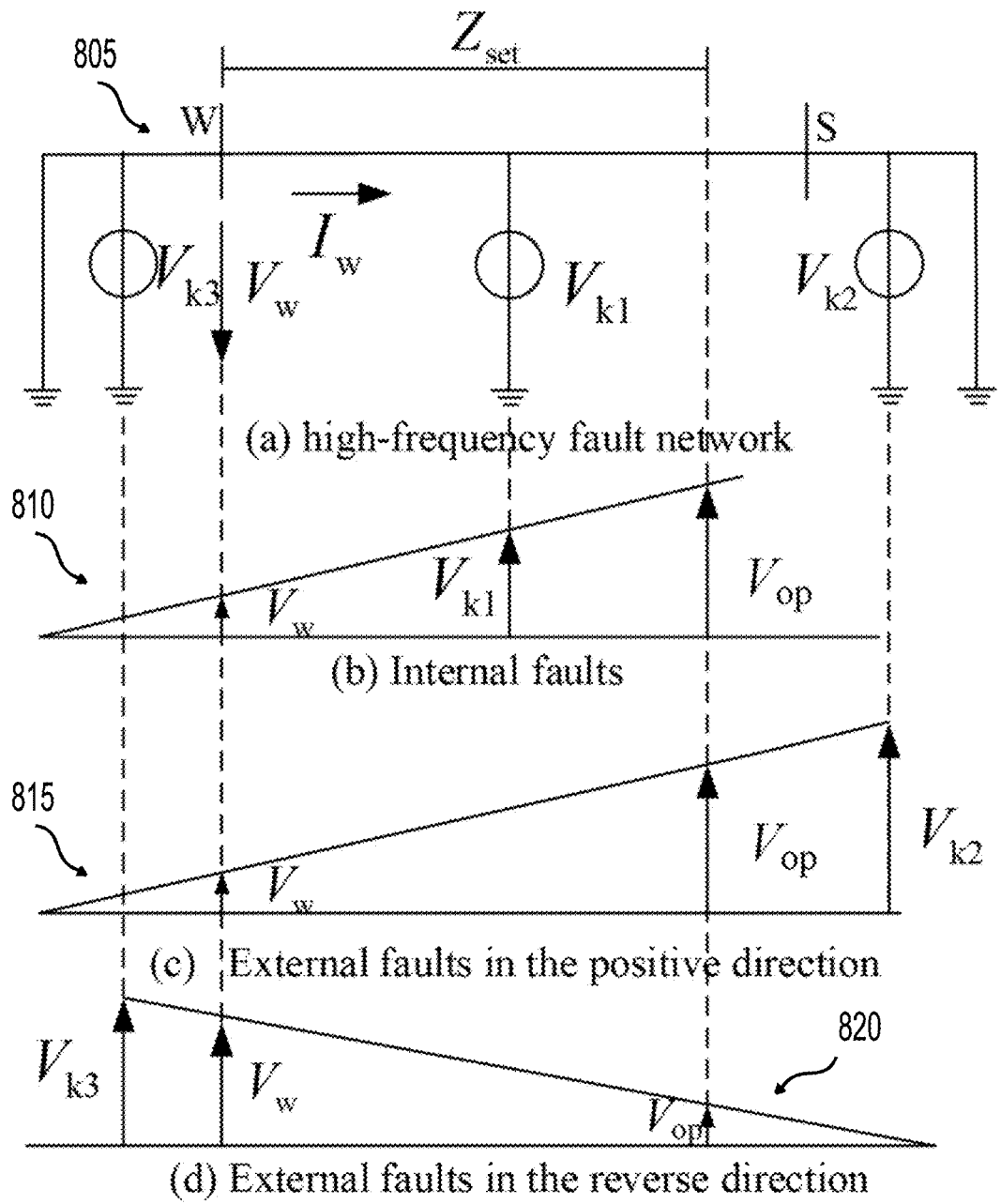
FIG. 8 shows an example high-frequency voltage distribution for a short circuit located at different points according to an embodiment of the present disclosure.

According to the questions (6) and (7), the high-frequency voltage distribution of the network 700 at different locations can be obtained, as shown in FIG. 8.

It can be seen from FIG. 8 that equation (8) is satisfied only for an internal fault of the transmission line 615:

$$|V_{op}| \geq |V_k| \quad (8)$$

Therefore, as shown in FIG. 8, internal and external faults of the transmission line 615 can be distinguished by comparing the magnitude of the high-frequency working voltage $V_{op}$ with the magnitude of the high-frequency voltage $V_k$ at the fault point. In FIG. 8, an example high-frequency fault network 805 is shown; a high-frequency voltage distribution diagram 810 of the network 805 at different locations for an example internal fault of the transmission line is shown; a high-frequency voltage distribution diagram 815 of the network 805 at different locations for an example external fault of the transmission line in the positive direction is shown; and a high-frequency voltage distribution diagram 820 of the network 805 at different locations for an example external fault of the transmission line in the reverse direction is shown.

However, the high-frequency voltage $V_k$ at the fault point cannot be directly measured. Therefore, it is necessary to use the voltage detected at the protection relay point (e.g., at the bus W) to construct an equivalent high-frequency voltage of the fault point. Since the voltage at the protection relay point before the fault occurs is basically equal to the voltage at the fault point before the fault occurs, it can be used to construct the high-frequency voltage $V_k$ at the fault point.

For a single-phase grounding fault, the variables in the above equations are the high-frequency voltage and the high-frequency current of the fault phase. For a phase-to-phase fault, $V_k = V_{k\varphi 1} - V_{k\varphi 2}$, $V_w = V_{w\varphi 1} - V_{w\varphi 2}$, and $I_w = I_{w\varphi 1} - I_{w\varphi 2}$, where $\varphi 1$ and $\varphi 2$ indicate the two fault phases, respectively.

B. Analysis of Impedance Circle Characteristics

When an internal fault occurs on the transmission line, the magnitude of the high-frequency operating voltage (i.e., the working voltage) and the high-frequency voltage at the fault point can be expressed as follows in equations (9) and (10), respectively:

$$|V_{op}|=|-I_w(Z_w+Z_{set})|=|-I_w||Z_w+Z_{set}| \quad (9)$$

$$|V_k|=|-I_w(Z_w+Z_k)-\alpha I_w R_g|=|-I_w||Z_w+Z_m| \quad (10)$$

where α is the high-frequency augmentation coefficient, $$\alpha = \frac{I_w + I_S}{I_w}.$$

The operation equation (11) of impedance circle can be obtained by substituting the equations (9) and (10) into the equation (8):

$$|Z_w+Z_{set}| \geq |Z_w+Z_m| \quad (11)$$

Figure 9:
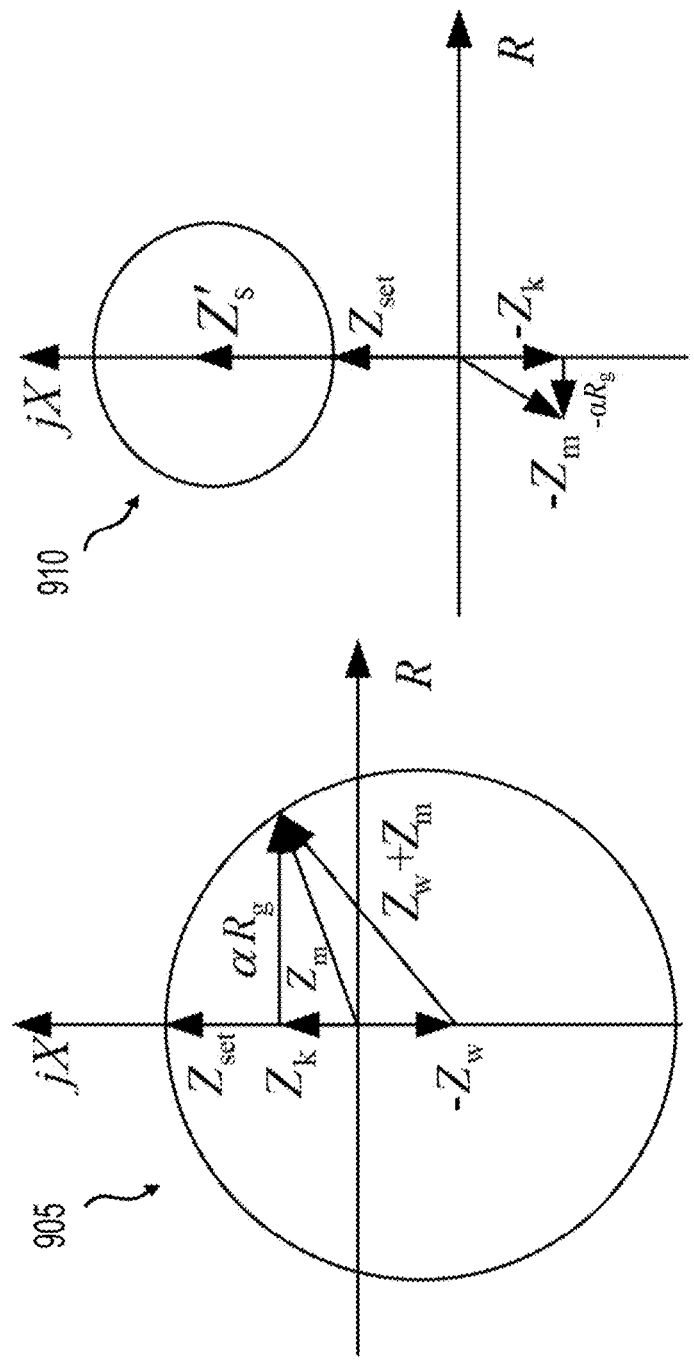
FIG. 9 shows characteristics of example impedance circles according to an embodiment of the present disclosure.

According to the equation (11), the impedance circle characteristics diagram 905 shown in FIG. 9 can be drawn.

Since the high-frequency impedance phase angles on both sides of the fault point are close to 90°, the currents $I_w$ and $I_s$ are basically in phase, and the additional impedance $\alpha R_g$ is approximately purely resistive. The magnitudes of the currents $I_w$ and $I_s$ depend only on the magnitudes of the high-frequency impedances on both sides of the fault point, respectively, and are not affected by the current limit loop. In addition, the radius of the impedance circle in the selected frequency range is much larger than that at the power frequency, and $\alpha R_g$ is independent of the frequency. Therefore, the protection method disclosed herein is capable of resisting fault resistance. And as the selected frequency increases, the ability to resist fault resistance can also be enhanced.

Similarly, the impedance circle characteristics for a fault located in the reverse direction can be also obtained, as shown in diagram 910 in FIG. 9. It can be seen from the diagram 910 that the protection disclosed herein can reliably not malfunction for a fault in the reverse direction. In the diagram 910, $Z_s'=Z_L+Z_s$ (also referring to FIG. 7).

C. Determination of Set Values of the Disclosed Distance Protection

In this example embodiment, the distance protection method disclosed herein uses a two-section distance protection to protect the entire length of the transmission line. The two sections may be referred to as zone I and zone II, respectively. The zone I distance protection section may be used as a quick-operating section, and the protect range may be about 80% to about 85% of the total length of the transmission line. Its setting value for the high-frequency impedance $Z_{set}^I$ can be expressed as equation (12):

$$Z_{set}^I = K_{rel}^I 2\pi f L \quad (12)$$

where $K_{rel}^I$ is a reliability coefficient of the zone I, which may be taken as 0.8 to 0.85, f is the selected frequency, and L is the total inductance of the transmission line.

For the zone II distance protection, the protection range is usually matched with the zone I distance protection in a lower-level line. Since this example embodiment does not include a lower-level line, the setting value of the high-frequency impedance for the zone II distance protection section may be set to be about 1.1 to about 1.3 times the high-frequency impedance of the transmission line equation as equation (13):

$$Z_{set}^{II} = K_{rel}^{II} 2\pi f L \quad (13)$$

where $K_{rel}^{II}$ is a reliability coefficient of the zone II, which can be taken as 1.1 to 1.3.

Since the high-frequency signal generated by a fault may only be detected within a 10 ms time window containing the moment of the fault (i.e., 5 ms before onset of the fault and 5 ms after onset the fault), and the setting time of the zone II distance protection may usually be about 0.3 to about 0.5 s, the high-frequency operating voltage and the high-frequency voltage at the fault point may no longer be compared at the end of the delay (i.e., after 0.3 to 0.5 s). In order to solve this problem, it is necessary to determine whether the fault point is within the protection range of zone II distance protection during occurrence of the fault, and then to determine whether the fault still exists at the end of the delay (i.e., after 0.3 to 0.5 s) by adding an auxiliary criterion. If the fault still persists at the end of delay, the zone II protection will operate to trip a corresponding circuit breaker.

In some embodiments, the auxiliary criterion can be constructed based on whether a fault current is present or absent. If the fault has been cut off before the end of the delay, RESs will no longer output the fault current. Therefore, the auxiliary criterion can be as equation (14):

$$i_{max} > i_{op} \quad (14)$$

where $i_{max}$ is the maximum value of the sampling current within a time window, and $i_{op}$ is a current threshold, which may be taken as 5% to 10% of the peak value of the rated current of the transmission line.

In some embodiments, the setting values of the high-frequency impedance of the zone I and zone II distance protection may be converted to the high-frequency operating (working) voltage $V_{op}^I$ and $V_{op}^{II}$, respectively.

Figure 10:
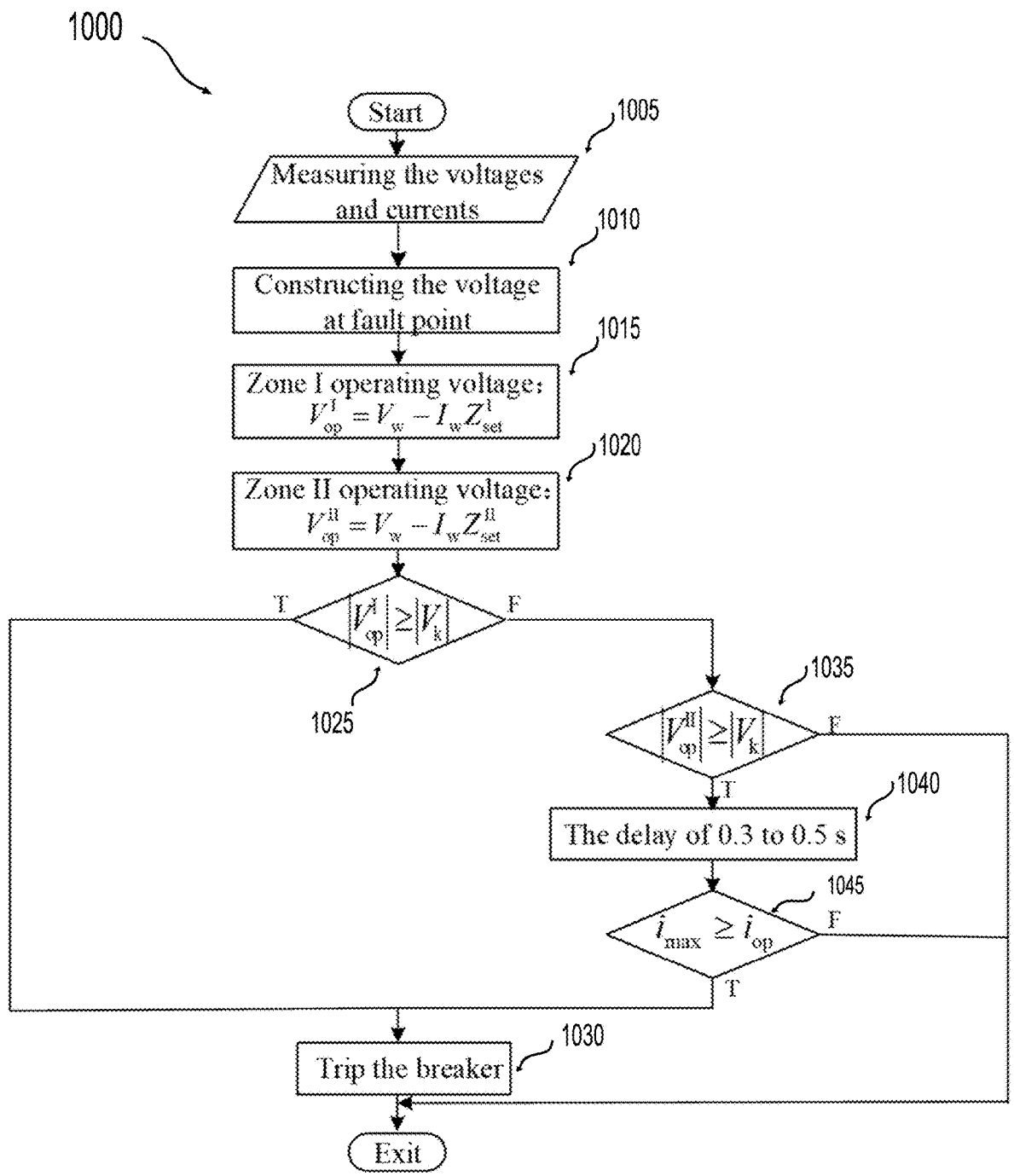
FIG. 10 shows a flow chart of an example high-frequency based distance protection method according to an embodiment of the present disclosure.

The detailed flowchart of the proposed protection is shown in FIG. 10. FIG. 10 shows a flow chart of an example high-frequency based distance protection method 1000 according to an embodiment of the present disclosure. The method 1000 may be implemented in a RES plant system, such as the system in FIG. 2, the system in FIG. 4, and the system in FIG. 6. The RES system may comprise one or more RESs, a collector bus (e.g., the bus W in FIG. 6), a transmission line, one or more protection relay devices, one or more direct current (DC) converters, and one or more circuit breakers.

The collector bus is configured to connect the one or more RESs to a first end of the transmission line. The transmission line may be connected to an alternating current (AC) power grid, for example, via a DC/AC converter, at a second end of the transmission line, where the second end of the transmission line is opposite to the first end of the transmission line. The one or more protection relay devices are connected to the RESs and the collector bus, and may be disposed between the RESs and the collector bus with a proximity to the collector bus side. The one or more DC converters are connected to the RESs and the collector bus, and may be disposed between the RESs and the collector bus with a proximity to the RESs side. That is, the one or more protection delay devices are disposed after the one or more DC converters in a direction from the RESs to the collector bus. The one or more circuit breakers may be disposed on the transmission line. For example, a first circuit breaker may be disposed around the first end of the transmission line (e.g., the circuit breaker 1 in FIG. 6), and a second circuit breaker may be disposed around the second end of the transmission line (e.g., the circuit breaker 2 in FIG. 6).

The RESs system may further comprise a controller. The controller may be configured to be in data communication with various components of the RES system, such as the one or more RESs, the collector bus, the transmission line, the one or more protection relay devices, the one or more direct current (DC) converters, and the one or more circuit breakers. The data communications between the controller and the various components may be performed via fiber cables. The controller can be configured to control operations of the RES system. The method 1000 may comprise the following steps.

In step 1005, the controller may monitor, measure and sample output voltages and currents of the one or more RESs. The controller may monitor, measure and sample output voltages and currents of the one or more RESs at the collector bus (e.g., the W side in FIGS. 6 and 7). For example, the controller may use the one or more protection relay devices or the one or more DC converters to monitor, measure and sample output voltages and currents of the one or more RESs. The controller may further determine whether a fault occurs. For example, the controller may monitor and measure an output current value of each DC/DC converter, and determine whether the output current value is greater than a self-protection current threshold of the DC/DC converter. In response to detecting the output current value being greater than the self-protection current threshold, the controller may determine that a fault has occurred. A blocking signal may also be transmitted to the one or more DC/DC converters and the DC/AC converter to block the one or more DC/DC converters and the DC/AC converter. The measured output voltages and currents may be stored by the controller in a data store, such as a memory or a database.

In step 1010, a high-frequency fault voltage $V_k$ may be constructed for a fault point. When detecting a fault has occurred at the fault point, a portion of the measured output voltages and currents of the RESs may be sampled by the controller, for example, using a sampling rate of 20 kHz. The portion of the measured output voltages and currents are the measured output voltages and currents within a time window of about 10 ms that may include about 5 ms prior to onset of the fault and about 5 ms after onset of the fault.

The controller may apply a wavelet transform to the sampled output voltages and currents to obtain high-frequency voltage signals (e.g., $V_w$) and high-frequency current signals (e.g., $I_w$) in a selected high-frequency range. The wavelet transform used herein can be any suitable wavelet transforms as known in the art. The selected high-frequency range may have a lower frequency limit that is determined by, the equations (1), (2), and/or (3), and an upper frequency limit of about 3 kHz. In the selected high-frequency range, the high-frequency impedance phase angle of the RESs is characterized by a stable impedance phase angle, for example, close to −90° or 90°, and is in phase with the high-frequency impedance phase angle of the transmission line. That is, the high-frequency impedance phase angle of the RESs exhibits the same or substantially similar characteristics as the high-frequency impedance phase angle of the transmission line in the selected high-frequency range.

The controller may determine a first protection high-frequency impedance value $Z_{set}^I$ for a first protection distance (zone I) of the transmission line in the selected high-frequency range. The first protection distance may be a length taken as from about 80% to about 85% the entire length of the transmission line. The first protection high-frequency impedance value $Z_{set}^I$ can be determined using the equation (12) in the selected high-frequency range.

The controller may further determine a second protection high-frequency impedance value net for a second protection distance (zone II) of the transmission line in the selected high-frequency range. The second protection distance may be a length taken as from about 15% to about 20% the entire length of the transmission line. The second protection high-frequency impedance value net can be determined using the equation (13) in the selected high-frequency range. Herein, the first protection distance (zone I) of the transmission line may be measured on the transmission line from the collector bus (e.g., the W side in FIG. 7) towards the AC grid (e.g., the S side in FIG. 7), and the second protection distance (zone II) of the transmission line can be the remaining length of the transmission line towards the AC grid (e.g., the S side in FIG. 7). That is, the first protection distance is measured from the first end of the transmission line towards the second end of the transmission line.

In the selected high-frequency range, the controller may further determine a high-frequency line impedance $Z_k$ from the fault point to the bus W, and an equivalent high-frequency impedance $Z_w$ of RESs.

The high-frequency fault voltage of the fault point in the selected high-frequency range can be constructed based on the obtained high-frequency voltage $V_w$ and high-frequency current $I_w$ at the collector bus W side (e.g., the protection relay device), the high-frequency line impedance $Z_k$ from the fault point to the bus W, the equivalent high-frequency impedance $Z_w$ of RESs, for example, by using the equations (7) or (10).

In step 1015, the controller may determine a first high-frequency operating/working voltage $V_{op}^I$ for the protection zone I in the selected high-frequency range. The first high-frequency operating/working voltage $V_{op}^I$ can be determined based on the obtained high-frequency voltage $V_w$ and high-frequency current $I_w$ at the collector bus W side (e.g., the protection relay device), the first protection high-frequency impedance value $Z_{set}^I$, and/or the equivalent high-frequency impedance $Z_w$ of RESs, for example, by using the equations (6) or (9).

In step 1020, the controller may determine a second high-frequency operating/working voltage $V_{op}^{II}$ for the protection zone II in the selected high-frequency range. The second high-frequency operating/working voltage $V_{op}^{II}$ can be determined based on the obtained high-frequency voltage $V_w$ and high-frequency current $I_w$ at the collector bus W side (e.g., the protection relay device), the second protection high-frequency impedance value net, and/or the equivalent high-frequency impedance $Z_w$ of RESs, for example, by using the equations (6) or (9).

In step 1025, the controller may compare the amplitude (absolute value) of the high-frequency fault voltage $V_k$ at the fault point with the amplitude (absolute value) of the first high-frequency operating/working voltage $V_{op}^I$. If the amplitude (absolute value) of the first high-frequency operating/working voltage $V_{op}^I$ is greater than or equal to the amplitude (absolute value) of the high-frequency fault voltage $V_k$ at the fault point, the fault is identified as an internal fault in the distance protection zone I of the transmission line, and the method 1000 will proceed to step 1030. In step 1030, the controller may transmit a trigger signal to a circuit breaker corresponding to the distance protection zone I (e.g., the first circuit breaker in this example) of the transmission line to cut off the fault.

If the amplitude (absolute value) of the first high-frequency operating/working voltage $V_{op}^I$ is less than the amplitude (absolute value) of the high-frequency fault voltage $V_k$ at the fault point, the method 1000 will proceed to step 1035.

In step 1035, the controller may compare the amplitude (absolute value) of the high-frequency fault voltage $V_k$ at the fault point with the amplitude (absolute value) of the second high-frequency operating/working voltage $V_{op}^{II}$. If the amplitude (absolute value) of the second high-frequency operating/working voltage $V_{op}^{II}$ is less than the amplitude (absolute value) of the high-frequency fault voltage $V_k$ at the fault point, the fault may be identified as an external fault with respect to the transmission line and the method 1000 will proceed to end the flow chart. The external fault may be an external fault in the positive direction of the transmission line or an external fault in the reverse direction (negative direction) of the transmission line, as shown in FIG. 8.

If the amplitude (absolute value) of the second high-frequency operating/working voltage $V_{op}^{II}$ is greater than or equal to the amplitude (absolute value) of the high-frequency fault voltage $V_k$ at the fault point, the method 1000 will proceed to step 1040. In step 1040, the controller is configured to execute a delay of a specified time period, for example, a delay of about 0.3 s to about 0.5 s. That is, the controller will determine whether the fault is still present after about 0.3 s to about 0.5 s.

In step 1045, the controller determines whether the fault is still present after about 0.3 s to about 0.5 s. The controller may use an auxiliary criterion based on whether a fault current is present or absent, such as the equation (14). For example, the controller may measure a current at the protection relay device on the W side after the delay of about 0.3 s to about 0.5 s. The current may be a maximum current value $i_{max}$ sampled in a time window (e.g., 5 ms). The controller may then compare $i_{max}$ with a current threshold $i_{op}$. The current threshold may be taken as 5% to 10% of the peak current value of the rated current of the RES. If the maximum current value $i_{max}$ is greater than or equal to the current threshold $i_{op}$, the controller determines that the fault still exists and identifies the fault as an internal fault occurred in the distance protection zone II of the transmission line. The method 1000 will proceed to step 1030. In step 1030, the controller may transmit a trigger signal to a circuit breaker corresponding to the distance protection zone II (e.g., the second circuit breaker in this example) of the transmission line to cut off the fault. Similarly, the controller may use an auxiliary criterion based on whether a fault voltage is present or absent to determine whether the fault still exist after a delay of a specified time period, for example, the delay of about 0.3 s to about 0.5 s.

In step 1045, if the fault has been cut off before the end of the delay, RESs will no longer output the fault current. That is, if the maximum current value $i_{max}$ is less than the current threshold $i_{op}$, the controller can determine that the fault does not exist anymore and may identify the fault as an external fault with respect to the transmission line. The method 1000 will proceed to end the flow chart. The external fault may be an external fault in the positive direction of the transmission line or an external fault in the reverse direction (negative direction) of the transmission line, as shown in FIG. 8.

IV. Experimental Verification and Analysis

Figure 11:
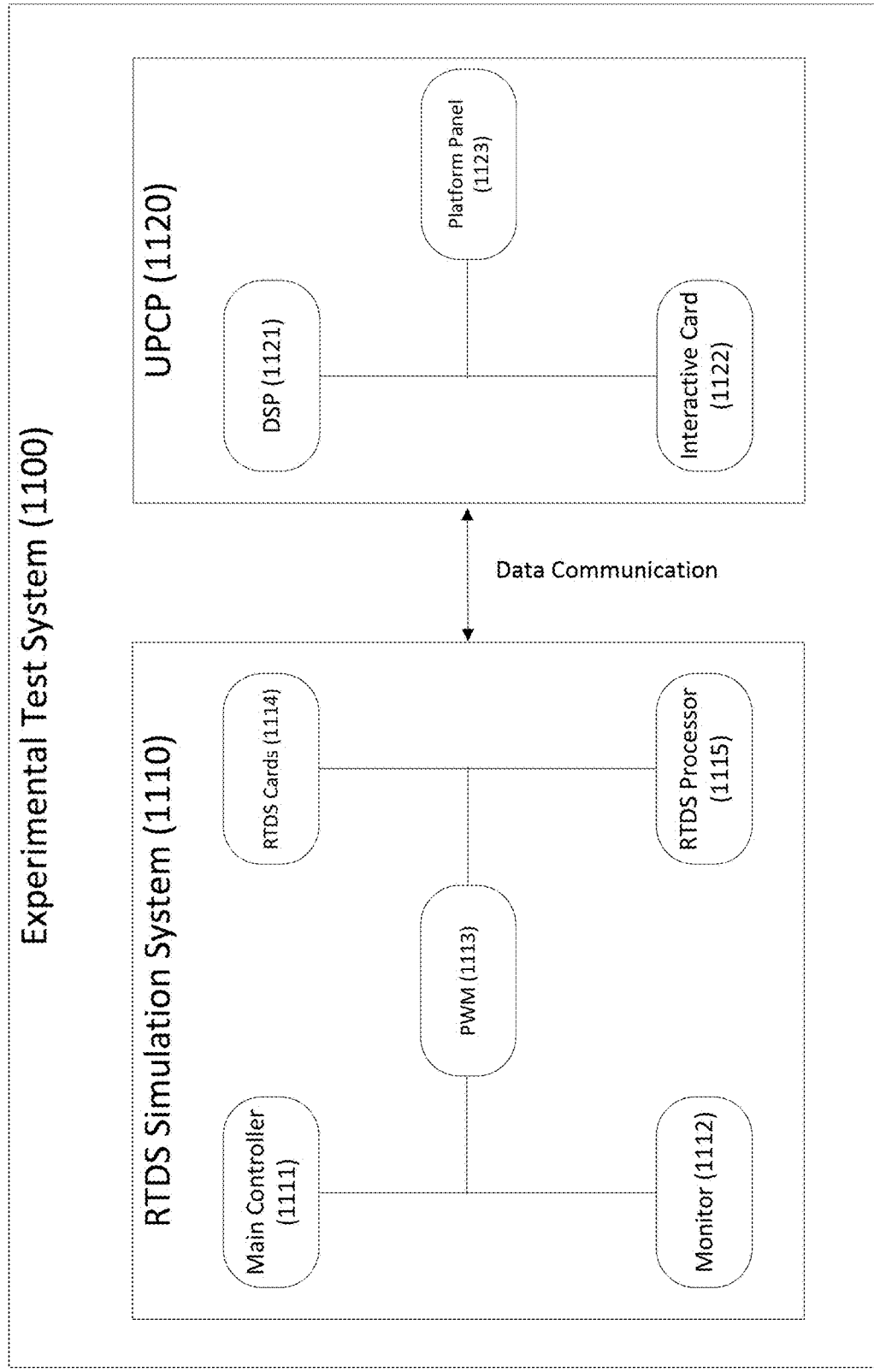
FIG. 11 shows an example experimental testing system according to an embodiment of the present disclosure.

To verify the distance protection disclosed herein, experimental tests have been performed on an example experimental test system 1100 described in FIG. 11. The experimental test system 1100 may comprise a RTDS simulation system/testing platform 1110 and a universal protection control platform (UPCP) 1120. The RTDS simulation system 1110 may comprise five main components: a main controller 1111, a monitor 1112, a pulse width modulation (PWM) generator 1113, one or more RTDS analog output card 1114, and a RTDS processor 1115. Those components of the RTDS simulation system 1110 can be in data communication with one another. The RTDS testing platform 1110 is designed to perform electromagnetic transient simulations and to output voltage and current data on the RES side in real time by analog output card 1114 and power amplifier. These data may then be input into the UPCP 1120 by fiber cables and an interactive card 1122 of the UPCP 1120. The UPCP 1120 may comprise a digital signal processor (DSP) 1121, the interactive card 1122, and a platform panel 1123. The components of the UPCP 1120 may be in data communication with one another. The UPCP 1120 may be in data communication with the RTDS simulation system 1110, for example, via fiber cables. The protection algorithm disclosed herein can be performed in the DSP 1121 on the UPCP 1220 to verify the distance protection disclosed herein.

In this embodiment, the example topological model 600 on RES plants illustrated in FIG. 6 is built on this experimental test system 1100. Power sources can be switched between IIREGs and DFIGs. Parameters of the IIREGs are illustrated in Table 1, and parameters of the EFIGs are illustrated in Table 2. The rated capacity of the RES power plant 605 is about 100 MW, the length of the transmission line 615 is about 40 km, and other experimental parameters of the experimental test system 1100 are detailed in Table 3. Faults are set on the 50%, 100% the length of the transmission line 615 from the main transformer 620 of the RES power plant, which are respectively marked as K1 and K2 (referring to FIG. 6). In this embodiment, the fault loop only contains a phase to ground loop and a phase to phase loop, so the fault types are set to phase-A grounding (AG) faults and phase-B-to-phase-C (BC) faults, respectively. The switching frequency of the inverter (e.g., the inverter in FIG. 2) is about 5 kHz. The bandwidth of the current loop may be 1/10 of the switching frequency of the inverter, so the selected frequency may be higher than 500 Hz. In this embodiment, since the upper frequency limit of the selected frequency range is 3 kHz, the sampling rate of the high-frequency signal (e.g., the high-frequency voltage signal and/or the high-frequency current signal) can be set to 20 kHz to sufficiently reflect the high-frequency signals.

TABLE 1

| Element | Parameter | Value |
|---|---|---|
| Inverter | Rated power | 1.5 MW |
| | Rated voltage | 2.2 kV |
| | Proportional gain of voltage/current controller | 0.75/0.35 p.u. |
| | Integration time constant of voltage/current controller | 0.875/0.005 p.u. |
| DC-link | Rated voltage | 1.2 kV |
| | Capacitor | 4500 μF |
| Step-up transf. | Rated capacity | 1.6 MW |
| | Rated transformation ratio | 35/2.2 kV |
| | Short circuit impedance | 6.76% |
| | Wire connection | Dyn |
| LCL filter | Capacitor | 200 μF |
| | Inductance | 1100/924 μH |
| | Resistance | 0.0001/0.0001/0.25 Ω |

TABLE 2 parameters of DFIGs

| Element | Parameter | Value | |
|---|---|---|---|
| Induction generator | Rated power | 1.5 | MW |
| | Rated voltage | 0.69 | kV |
| | Stator resistance | 0.023 | p.u. |
| | Stator leakage inductance | 0.180 | p.u. |
| | Rotor resistance | 0.016 | p.u. |
| | Rotor leakage inductance | 0.160 | p.u. |
| | Mutual inductance | 3.48 | p.u. |
| | Turn ratio | 0.29 | |
| Rotor-side converter | Proportional gain of power/current controller | 0.9/0.85 | p.u. |
| | Integration time constant of power/current controller | 0.05/0.03 | p.u. |
| Crowbar | Resistance | 0.5 | Ω |
| Filter capacitor | Capacity | 120 | kVar |
| Step-up transf. | Rated capacity | 1.6 | MW |
| | Rated transformation ratio | 35/0.58 | kV |
| | Short circuit impedance | 6.76% | |
| Grid-side converter | Proportional gain of voltage/current controller | 3/1.21 | p.u. |
| | Integration time constant of voltage/current controller | 0.13/0.01 | p.u. |

TABLE 3 other experimental parameters

| Element | Parameter | Value | |
|---|---|---|---|
| Outgoing transmission line | Voltage level | 220 | kV |
| | Length | 40 | km |
| | Positive-sequence impedance | 0.076 + j0.338 | Ω/km |
| | Zero-sequence impedance | 0.284 + j0.824 | Ω/km |
| | Positive-sequence capacitor | 0.0086 | μF/km |
| | Zero-sequence capacitance | 0.0061 | μF/km |
| Main grid | Equivalent sequence impedances | 0.4 + j12.568 | Ω |
| Main transf. | Rated capacity | 100 | MVA |
| | Rated transformation ratio | 220/35 | kV |
| | Wire connection | YNd | |
| | Short circuit impedance | 6% | |
| Distance protection | $K^I_{rel}$ | 0.85 | |
| | $K^{II}_{rel}$ | 1.1 | |

A. High Frequency Impedance Angle of RESs

Figure 12:
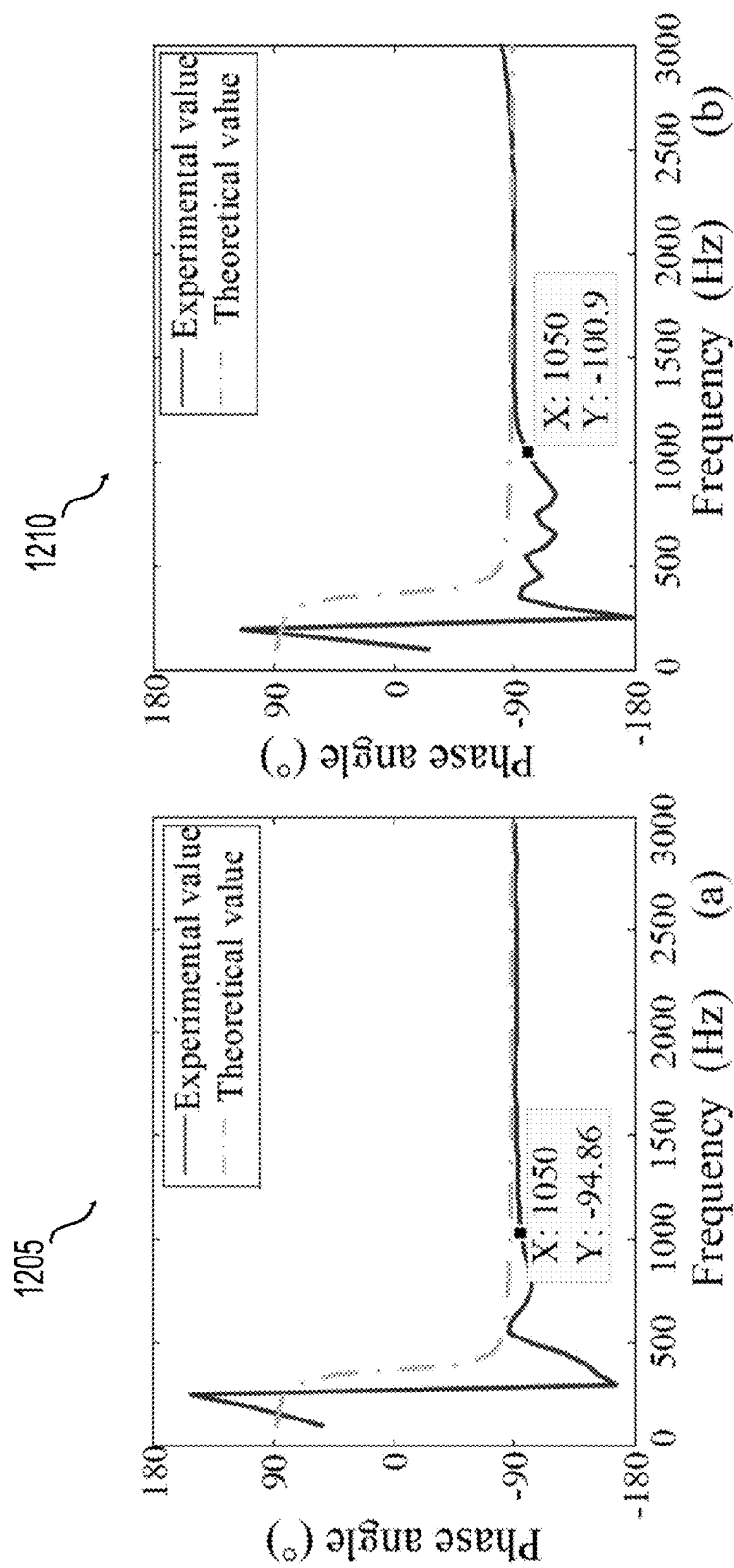
FIG. 12 shows example high-frequency impedance phase angles of IIREG during faults according to an embodiment of the present disclosure.

In order to make the disclosed distance protection have better performance, it is necessary to ensure that the impedance angle of the high-frequency impedance model of RESs is close to 90° in the selected high-frequency range. According to the reference positive direction of the protection, the measured high-frequency impedance phase angle should be close to −90°. Generally, there are three control strategies for IIREGs: 1) eliminating the negative-sequence current (k=0), 2) eliminating reactive power oscillations (k=1) and 3) eliminating active power oscillations (k=−1), where k is a control factor. FIG. 12 shows the example measured high-frequency impedance phase angles when a BC fault and an AG fault occur at the transmission line in the case of k=0. The diagram 1205 in FIG. 12 shows the measured/experimental phase angle values when a BC fault occurs on the transmission line. The diagram 1210 in FIG. 12 shows the measured/experimental phase angle values when an AG fault occurs on the transmission line. The high-frequency impedance phase angle diagrams under other control strategies (k=1 and k=−1) are similar because the protection method disclosed herein is unaffected by the control system strategies.

According to the actual parameters of the LCL filter of the IIREG (referring to FIG. 2), the selected frequency may be greater than 1073 Hz. It can be seen from FIG. 12 that the measured phase angle is closed to −90° in the frequency range of above about 1050 Hz, which is consistent with the theoretical analysis.

Figure 13:
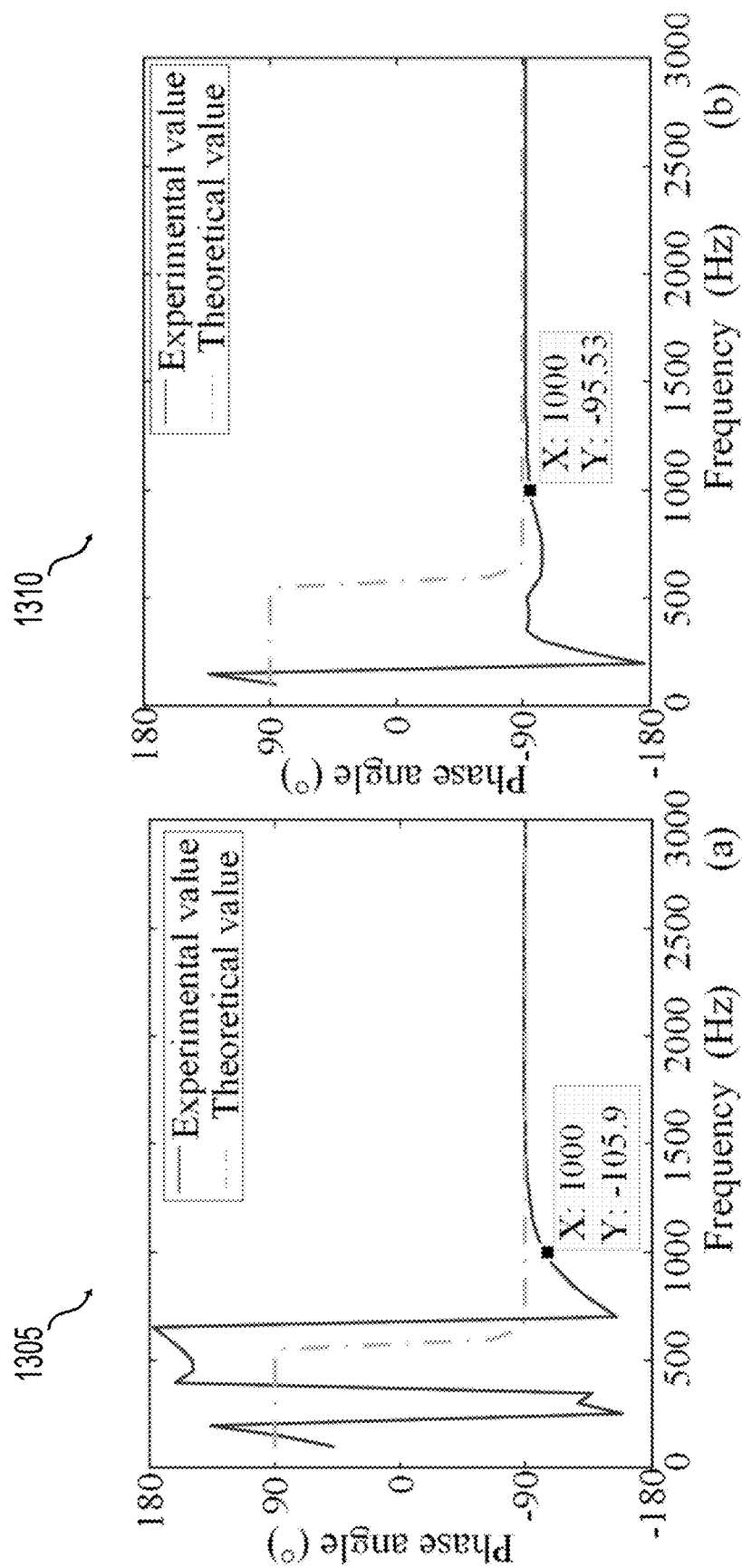
FIG. 13 shows example high-frequency impedance phase angles of DFIG during faults according to an embodiment of the present disclosure.

FIG. 13 shows the example measured high-frequency impedance phase angles when a BC fault and an AG fault occur at the transmission line when DFIG power source is used. The diagram 1305 in FIG. 13 shows the measured/experimental phase angle values when a BC fault occurs on the transmission line. The diagram 1310 in FIG. 13 shows the measured/experimental phase angle values when an AG fault occurs on the transmission line. According to actual parameters of the model 600, in order to make the DFIG equivalent high-frequency impedance angle close to 90°, the selected frequency should be above 1010 Hz. It can be seen from FIG. 13 that regardless of BC faults or AG faults, the measured high-frequency phase angle is inductive and close to −90° in the selected frequency range of above about 1050 Hz. This is because the sum of the inductive reactance of the main transformer, the step-up transformer and the collection system is far greater than the equivalent capacitive reactance of DFIGs in the selected high-frequency range (referring to FIG. 6), so the overall state of the model 600 exhibits an inductive state.

B. Performance of the Disclosed Distance Protection

Figure 14:
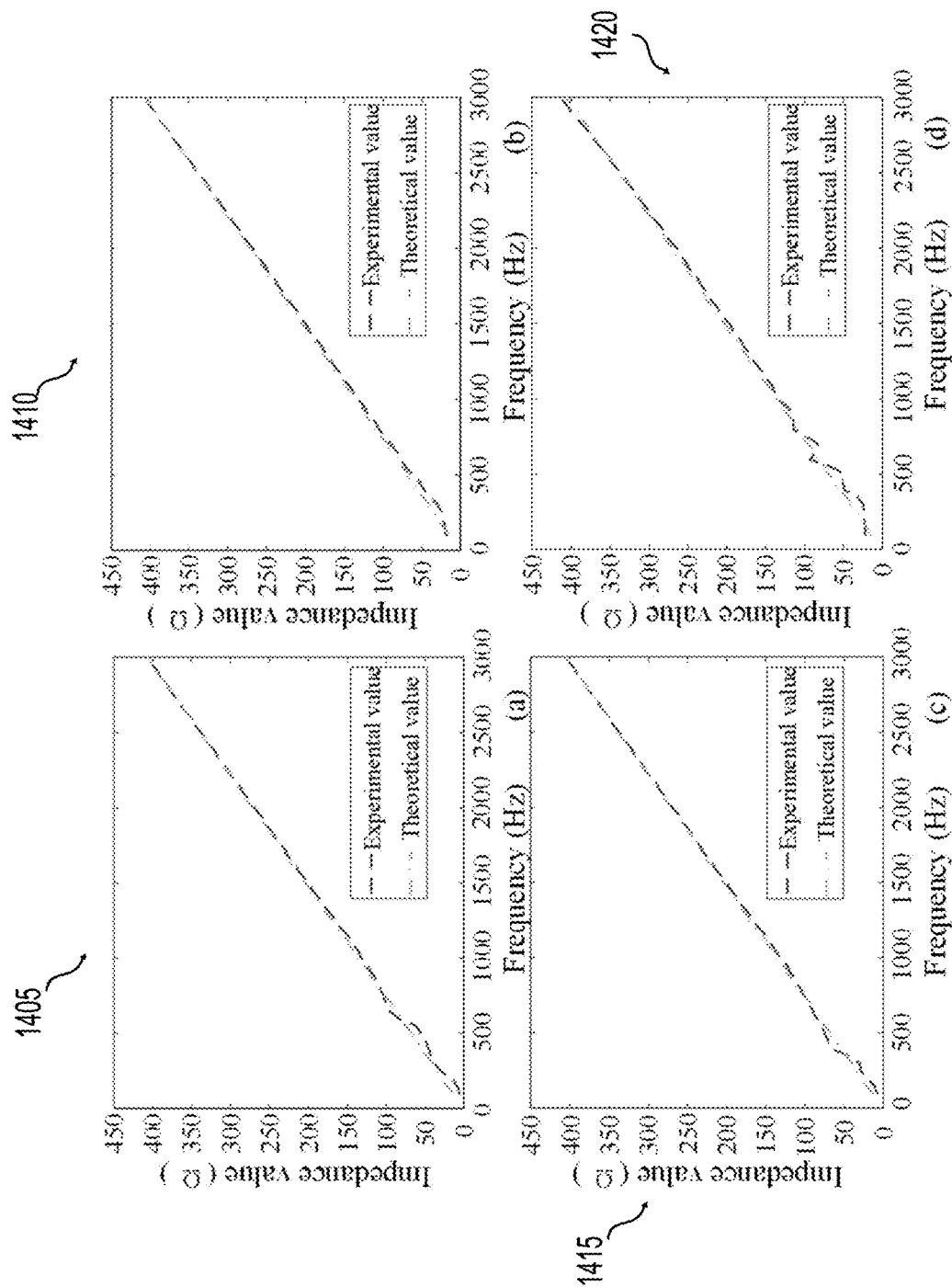
FIG. 14 shows example high-frequency impedance values calculated using virtual fault voltage according to an embodiment of the present disclosure.

Since the high-frequency voltage at a fault point cannot be directly measured, it is necessary to use the voltage at the protection relay point (e.g., at the bus W side in FIG. 6) to construct a virtual high-frequency voltage at the fault point. FIG. 14 shows the high-frequency equivalent impedance values (i.e., theoretical values) calculated using the constructed virtual high-frequency voltage at a fault point. In this example, the fault point is set at point K1 (referring to FIG. 6), the fault resistance (i.e., the transient resistance $R_g$ in FIG. 7) is set to 0Ω, and the fault types are BC and AG faults, respectively. As shown in FIG. 14, the diagram 1405 shows the impedance values calculated using a virtual fault voltage for a BC fault when IIREGs are used as power sources, along with corresponding experimental measured values. The diagram 1410 shows the impedance values calculated using a virtual fault voltage for an AG fault when IIREGs are used as power sources, along with corresponding experimental measured values. The diagram 1415 shows the impedance values calculated using a virtual fault voltage for a BC fault when DFIGs are used as power sources, along with corresponding experimental measured values. The diagram 1420 shows the impedance values calculated using a virtual fault voltage for an AG fault when DFIGs are used as power sources, along with corresponding experimental measured values.

It can be seen from FIG. 14 that the experimental values of the high-frequency impedance are in good agreement with the theoretical values in the selected frequency range of above 1 kHz. There are slight fluctuations below 1 kHz because of the influence of the low-frequency harmonic output by RESs. This can prove that the constructed virtual high-frequency voltage at a fault point is equivalent to the real high-frequency voltage at the fault point.

Figure 15:
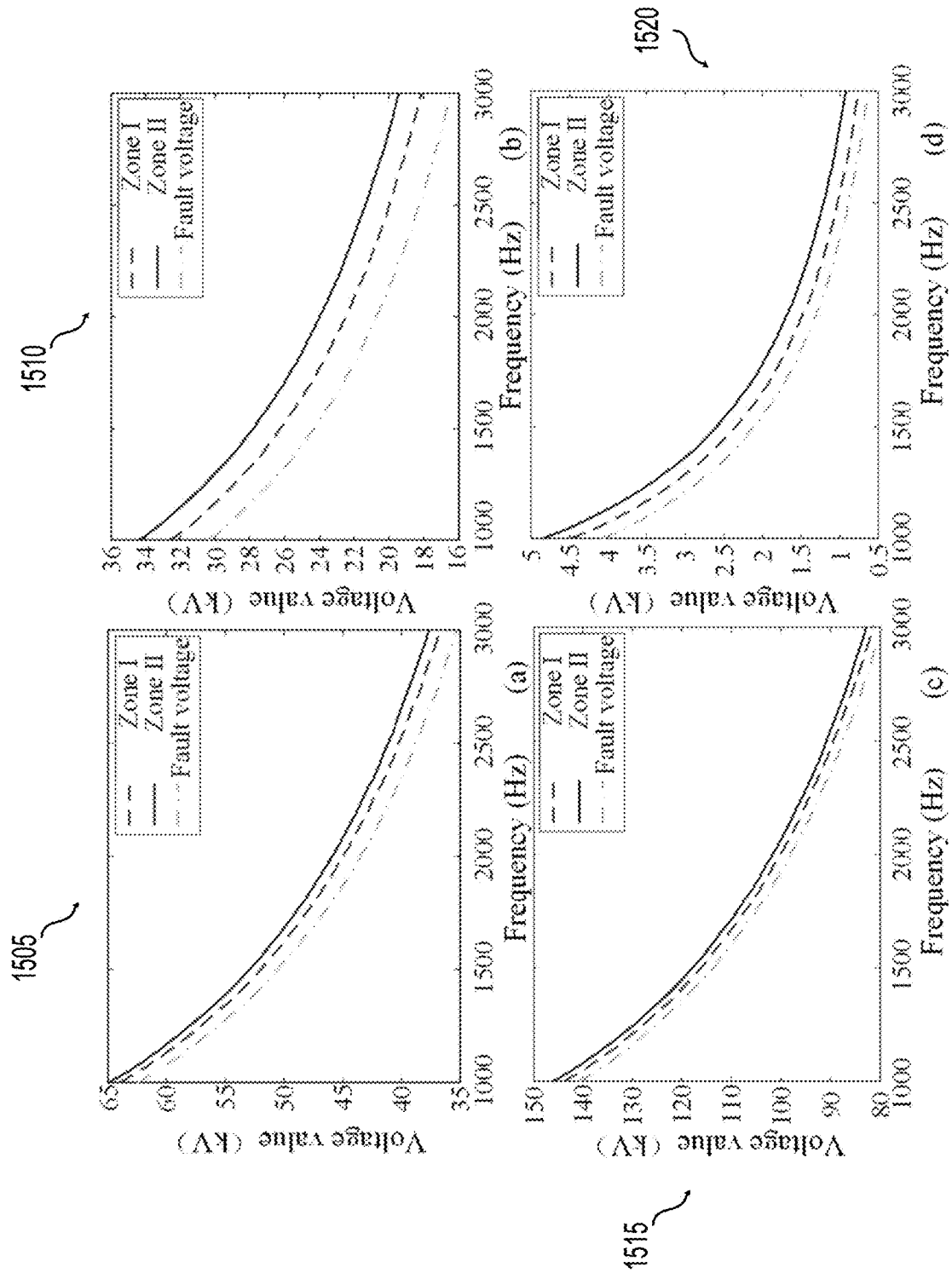
FIG. 15 shows example performance of the disclosed zone I distance protection for different fault types according to an embodiment of the present disclosure.

On this basis, in order to verify the performance of the zone I distance protection, a fault point is still set at K1, and the experimental results are shown in FIG. 15. In FIG. 15, "zone I" and "zone II" stand for the zone I operating (working) voltage and the zone II operating (working) voltage, respectively, and the "fault voltage" stands for the constructed high-frequency voltage at the fault point. As shown in FIG. 15, the diagram 1505 shows the zone I operating voltage, the zone II operating voltage, and the constructed high-frequency voltage at the fault point for a BC fault when IIREGs are used as power sources. The diagram 1510 shows the zone I operating voltage, the zone II operating voltage, and the constructed high-frequency voltage at the fault point for an AG fault when IIREGs are used as power sources. The diagram 1515 shows the zone I operating voltage, the zone II operating voltage, and the constructed high-frequency voltage at the fault point for a BC fault when DFIGs are used as power sources. The diagram 1520 shows the zone I operating voltage, the zone II operating voltage, and the constructed high-frequency voltage at the fault point for an AG fault when DFIGs are used as power sources.

It can be seen from FIG. 15 that the constructed voltage at the fault point is lower than the zone I operating voltage and the zone II operating voltage when a metallic AG or BC fault occurs at the midpoint of the outgoing transmission line (e.g., K1 in FIG. 6). This demonstrates that the zone I distance protection can operate reliably.

Figure 16:
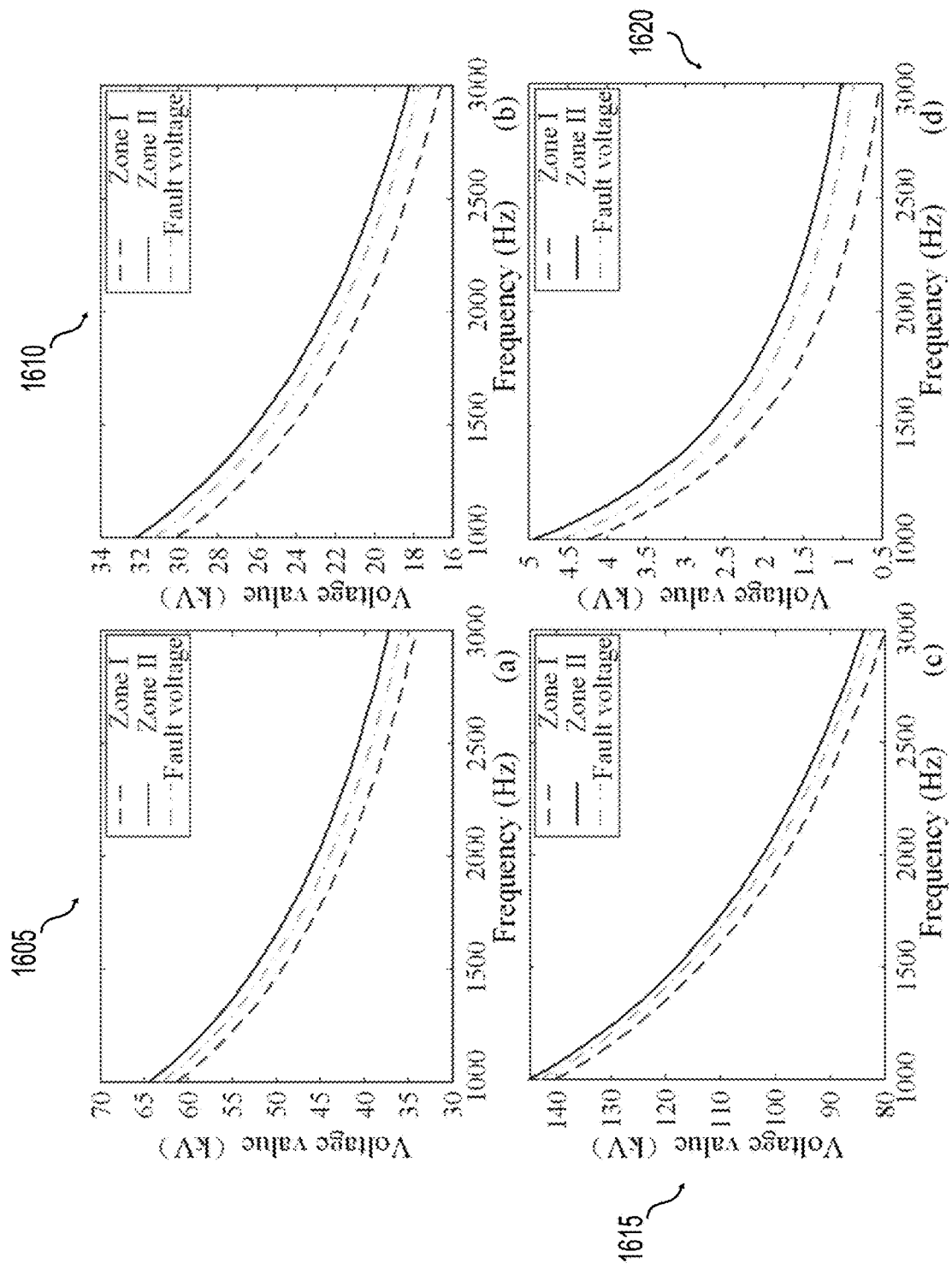
FIG. 16 shows example performance of the disclosed zone II distance protection for different fault types according to an embodiment of the present disclosure.

At the same time, in order to verify the performance of the zone II distance protection, a fault point is set to K2 (referring to FIG. 6) in this example. The experimental results are shown in FIG. 16. In FIG. 16, "zone I" and "zone II" stand for the zone I operating (working) voltage and the zone II operating (working) voltage, respectively, and the "fault voltage" stands for the constructed high-frequency voltage at the fault point. As shown in FIG. 16, the diagram 1605 shows the zone I operating voltage, the zone II operating voltage, and the constructed high-frequency voltage at the fault point for a BC fault when IIREGs are used as power sources. The diagram 1610 shows the zone I operating voltage, the zone II operating voltage, and constructed high-frequency voltage at the fault point for an AG fault when IIREGs are used as power sources. The diagram 1615 shows the zone I operating voltage, the zone II operating voltage, and the constructed high-frequency voltage at the fault point for a BC fault when DFIGs are used as power sources. The diagram 1620 shows the zone I operating voltage, the zone II operating voltage, and the constructed high-frequency voltage at the fault point for an AG fault when DFIGs are used as power sources.

It can be seen from FIG. 16 that the constructed voltage at the fault point is higher than the zone I operating voltage and lower than the zone II operating voltage when a metallic AG or BC fault occurs at the end of the outgoing transmission line. In this case, the zone II distance protection can also operate reliably.

C. Influence of the Fault Resistance

Figure 17:
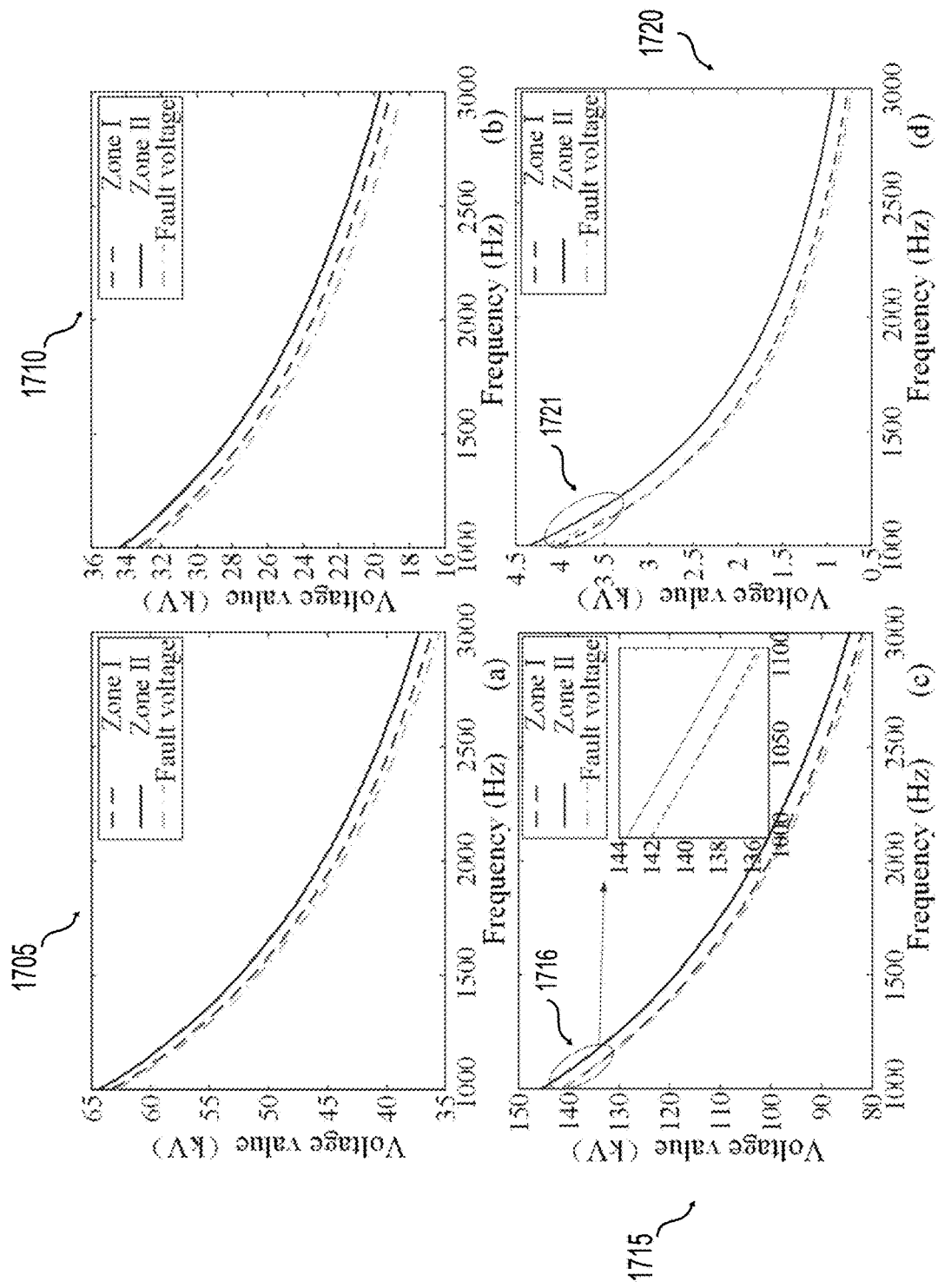
FIG. 17 shows effects of fault resistance on the disclosed zone I distance protection for different fault types according to an embodiment of the present disclosure.

In order to verify the effect of the fault resistance (e.g., $R_g$ in FIG. 7) on the zone I distance protection, the fault point is set at K1. In this example, for BC faults, the fault resistance is set to 80Ω, and the fault resistance is set to 100Ω for AG faults. The experimental results are shown in FIG. 17. In FIG. 17, "zone I" and "zone II" stand for the zone I operating (working) voltage and the zone II operating (working) voltage, respectively, and the "fault voltage" stands for the constructed high-frequency voltage at the fault point. As shown in FIG. 17, the diagram 1705 shows the zone I operating voltage, the zone II operating voltage, and the constructed high-frequency voltage at the fault point for a BC fault when IIREGs are used as power sources. The diagram 1710 shows the zone I operating voltage, the zone II operating voltage, and the constructed high-frequency voltage at the fault point for an AG fault when IIREGs are used as power sources. The diagram 1715 shows the zone I operating voltage, the zone II operating voltage, and the constructed high-frequency voltage at the fault point for a BC fault when DFIGs are used as power sources. The diagram 1720 shows the zone I operating voltage, the zone II operating voltage, and the constructed high-frequency voltage at the fault point for an AG fault when DFIGs are used as power sources.

It can be seen from the diagram 1705 and the diagram 1710 that for IIREGs, the zone I distance protection can withstand the resistance of 80Ω for a BC fault, and 100Ω for an AG fault. In addition, as can be seen from the diagram 1715 and the diagram 1720, the zone I distance protection may reject to operate in a lower frequency range for DFIGs regardless of whether the fault type is a BC fault or an AG fault. For example, in the lower frequency ranges as indicated by circles 1716 and 1721, the fault voltages appears to be slightly greater than the corresponding zone I operating voltages, which may lead to the refusal of action by the zone I distance protection. However, the zone I distance protection can operate correctly in the frequency range of above 1.5 kHz. This is because the impedance circle becomes larger as the selected frequency increases.

Figure 18:
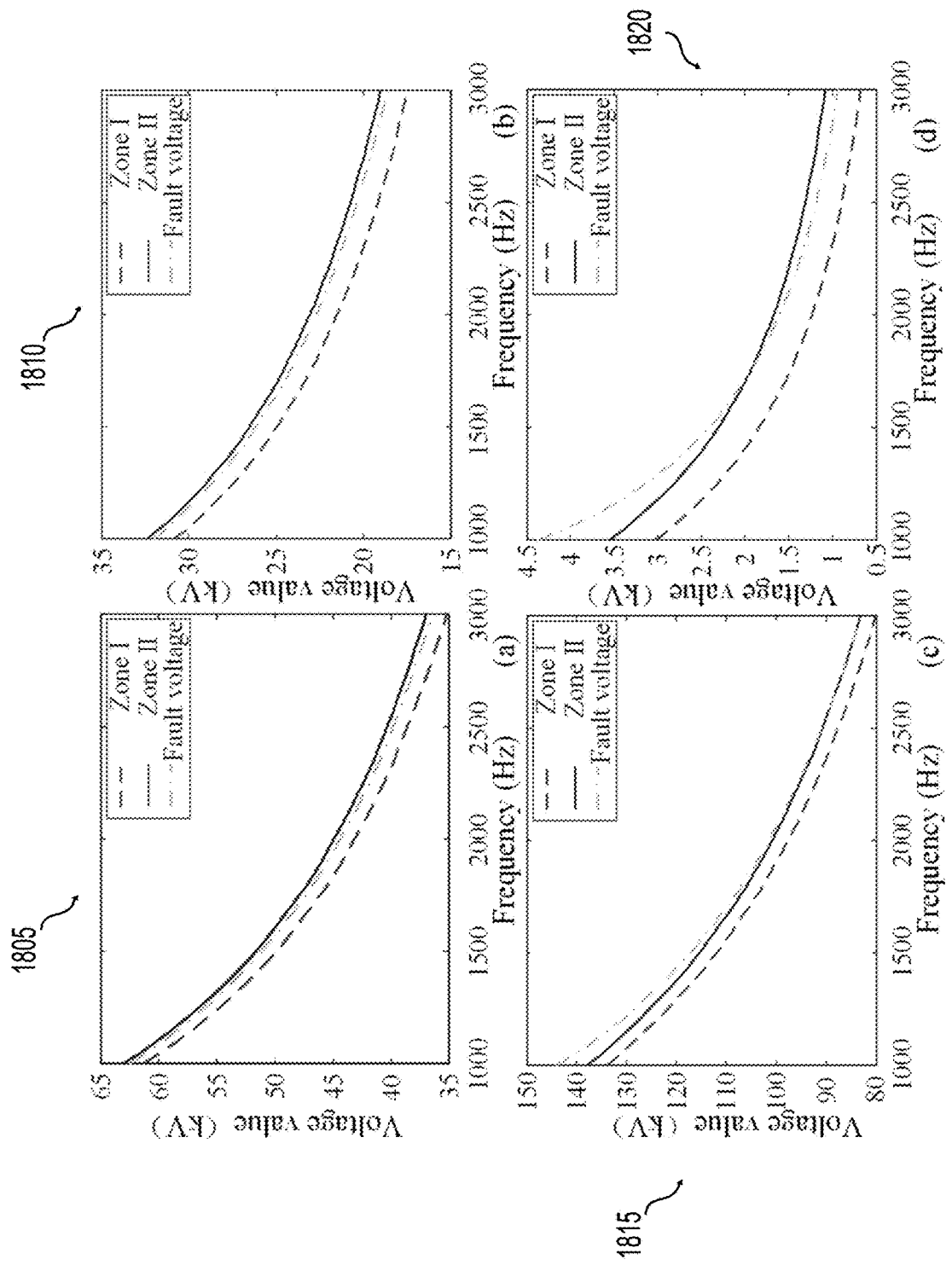
FIG. 18 shows effects of fault resistance on the disclosed zone II distance protection for different fault types according to an embodiment of the present disclosure.

At the same time, in order to verify the influence of the fault resistance on the zone II distance protection, a fault point is set at K2, and the fault resistance is 80Ω for a BC fault, and 100Ω for an AG fault. The experimental results are illustrated in FIG. 18. In FIG. 18, "zone I" and "zone II" stand for the zone I operating (working) voltage and the zone II operating (working) voltage, respectively, and the "fault voltage" stands for the constructed high-frequency voltage at the fault point. As shown in FIG. 18, the diagram 1805 shows the zone I operating voltage, the zone II operating voltage, and the constructed high-frequency voltage at the fault point for a BC fault when IIREGs are used as power sources. The diagram 1810 shows the zone I operating voltage, the zone II operating voltage, and the constructed high-frequency voltage at the fault point for an AG fault when IIREGs are used as power sources. The diagram 1815 shows the zone I operating voltage, the zone II operating voltage, and the constructed high-frequency voltage at the fault point for a BC fault when DFIGs are used as power sources. The diagram 1820 shows the zone I operating voltage, the zone II operating voltage, and the constructed high-frequency voltage at the fault point for an AG fault when DFIGs are used as power sources.

It can be seen from diagram 1805 and the diagram 1810 that for IIREGs, the zone II distance protection can also withstand the resistance of 80Ω for BC faults, and 100Ω for AG faults. On the other hand, it can be known from the diagram 1815 that for DFIGs, the zone II distance protection may reject to operate in the frequency range of about 1 KHz to about 3 kHz when a BC fault occurs at the end of transmission line (e.g., K2 in FIG. 6), because the fault voltages appear to be greater than the corresponding zone II operating voltages in this frequency range. In addition, it can be known from the diagram 1820 that for DFIGs, the zone II distance protection may reject to operate for an AG fault in the frequency range of about 1 kHz to about 2 kHz, because the fault voltages appear to be greater than the corresponding zone II operating voltages in this frequency range. However, it can operate correctly when the selected frequency reaches above about 2 kHz.

D. Influence of Noise

The RES power system may be susceptible to electromagnetic interference, and its voltage and current signals may include noise to some extent, so the disclosed distance protection method should be able to withstand a certain level of noise. In order to verify the anti-noise ability of the disclosed distance protection scheme, Table 4 illustrates the performance of the disclosed distance protection for IIREGs and DFIGs with signal-to-noise ratio (SNR) of 20 dB, 30 dB, and 40 dB. In this example embodiment, the noise added is Gaussian white noise, the fault point is set as K1, the fault type is BC faults, and the fault resistance is 0Ω.

TABLE 4 performance of the disclosed distance protection under different noise

| Protection | Frequency (kHz) | IIREGs 20 | IIREGs 30 | IIREGs 40 | DFIGs 20 | DFIGs 30 | DFIGs 40 |
|---|---|---|---|---|---|---|---|
| Zone I | 1 | X | ✓ | ✓ | X | ✓ | ✓ |
|  | 1.5 | X | ✓ | ✓ | X | ✓ | ✓ |
|  | 2 | ✓ | ✓ | ✓ | ✓ | ✓ | ✓ |
|  | 2.5 | X | ✓ | ✓ | X | ✓ | ✓ |
|  | 3 | X | ✓ | ✓ | ✓ | ✓ | ✓ |
| Zone II | 1 | X | ✓ | ✓ | X | ✓ | ✓ |
|  | 1.5 | X | ✓ | ✓ | X | ✓ | ✓ |
|  | 2 | ✓ | ✓ | ✓ | ✓ | ✓ | ✓ |
|  | 2.5 | X | ✓ | ✓ | X | ✓ | ✓ |
|  | 3 | X | ✓ | ✓ | ✓ | ✓ | ✓ |

Note:
✓ stands for an internal fault, X stands for an external fault.

It can be seen from Table 4 that the disclosed distance protection can operate correctly under different selected frequencies with a SNR of 30 dB. This is because the added noise below 30 dB has little effect on the voltage drop when a fault occurs at the transmission line. However, when the added noise reaches 20 dB, the disclosed distance protection method may exhibit fluctuations at the different selected frequencies.

E. Influence of the Capacitance to Ground

Figure 19:
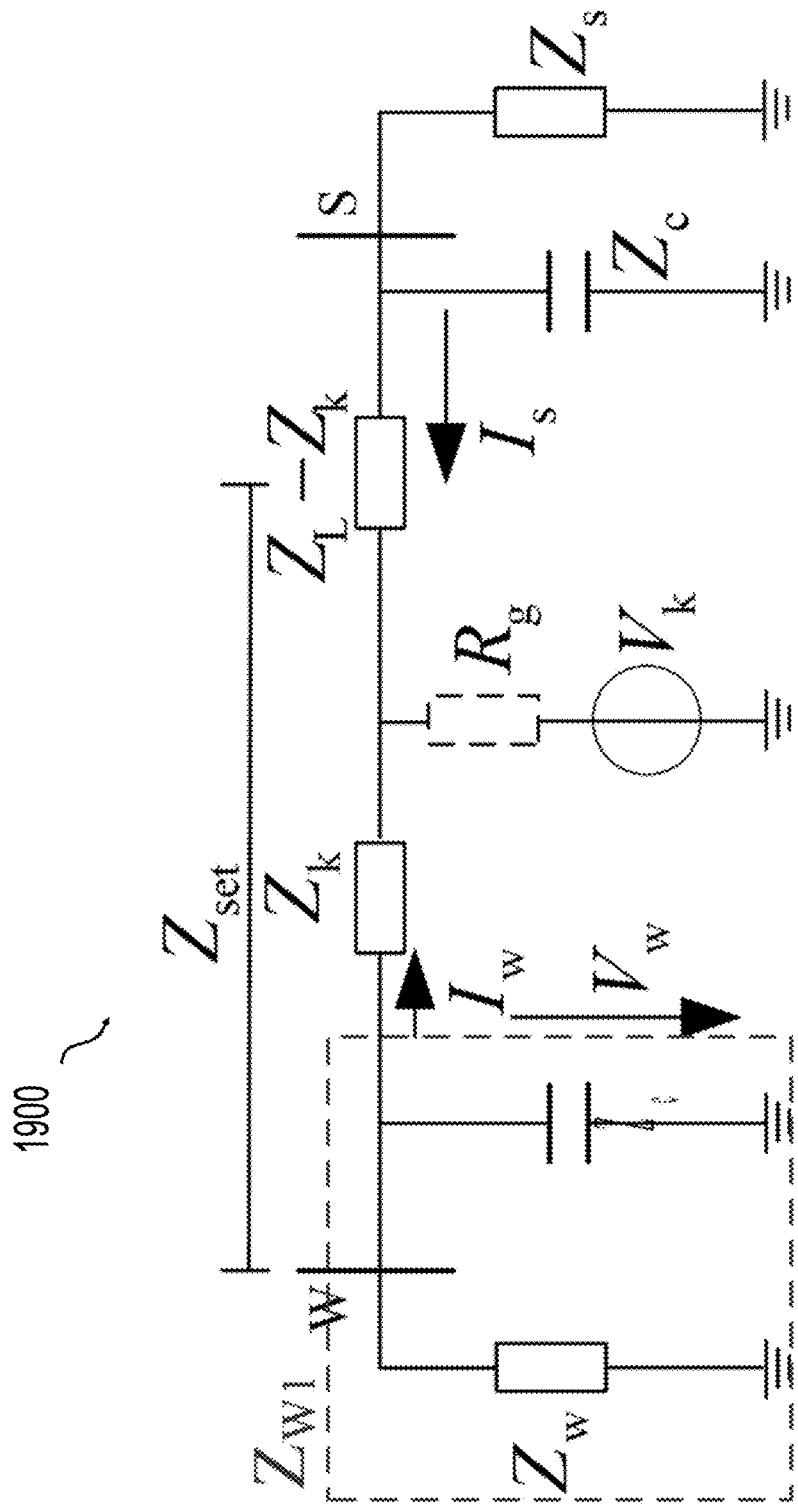
FIG. 19 shows an example high-frequency equivalent circuit with capacitance to ground according to an embodiment of the present disclosure.

When considering the capacitance to ground of the transmission line, a high-frequency equivalent circuit 1900 of the model 600 is shown in FIG. 19. In this circuit 1900, $Z_c$ is the equivalent impedance of the capacitance to ground for the transmission line, which is in parallel with the RES impedance $Z_w$, and is in series with the impedance $Z_k$ of the transmission line. In this example, the disclosed distance protection method is not affected by the resonance frequency of the transmission line.

However, the current flowing through the impedance $Z_k$ may be inductive, so the capacitive impedance $Z_c$ cannot be equal to the inductive impedance $Z_w$. According to this condition, the frequency upper limit of the selected frequency range may be determined as 0.9 times the resonance frequency of $Z_w$ and $Z_c$.

Figure 20:
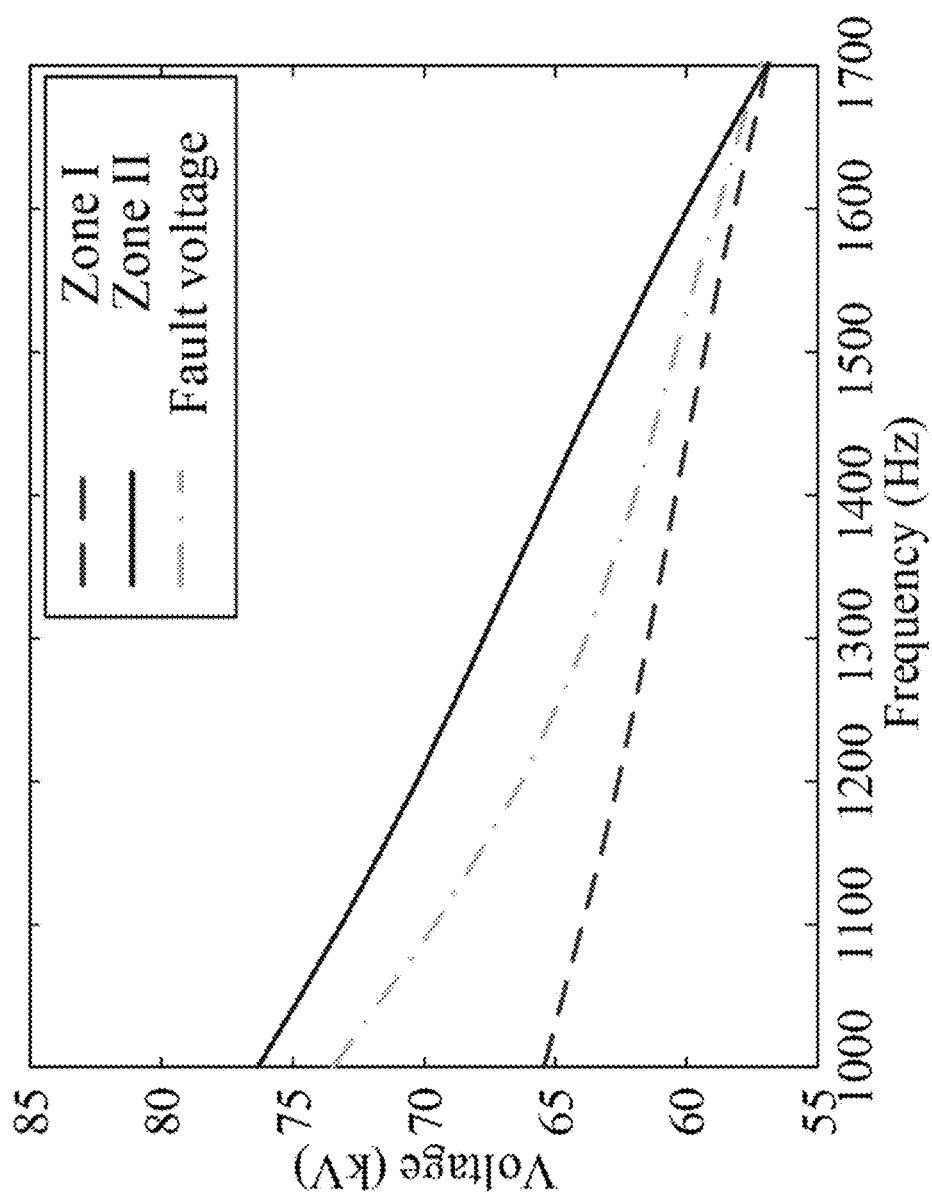
FIG. 20 shows example performance of the disclosed distance protection under effects of the capacitance to ground according to an embodiment of the present disclosure.

In order to illustrate this problem, simulations have been performed and an example result of the simulations is shown in FIG. 20. In this example simulation, the power source is DFIGs, and the fault point is set at the end of the transmission line (e.g., K2 in FIG. 6), so the resonance frequency of the transmission line may be about 1.3 kHz.

It can be seen from FIG. 20 that the resonance frequency of the transmission line does not have any influence on the disclosed distance protection method.

V. Field Testing Data Analysis

Figure 21:
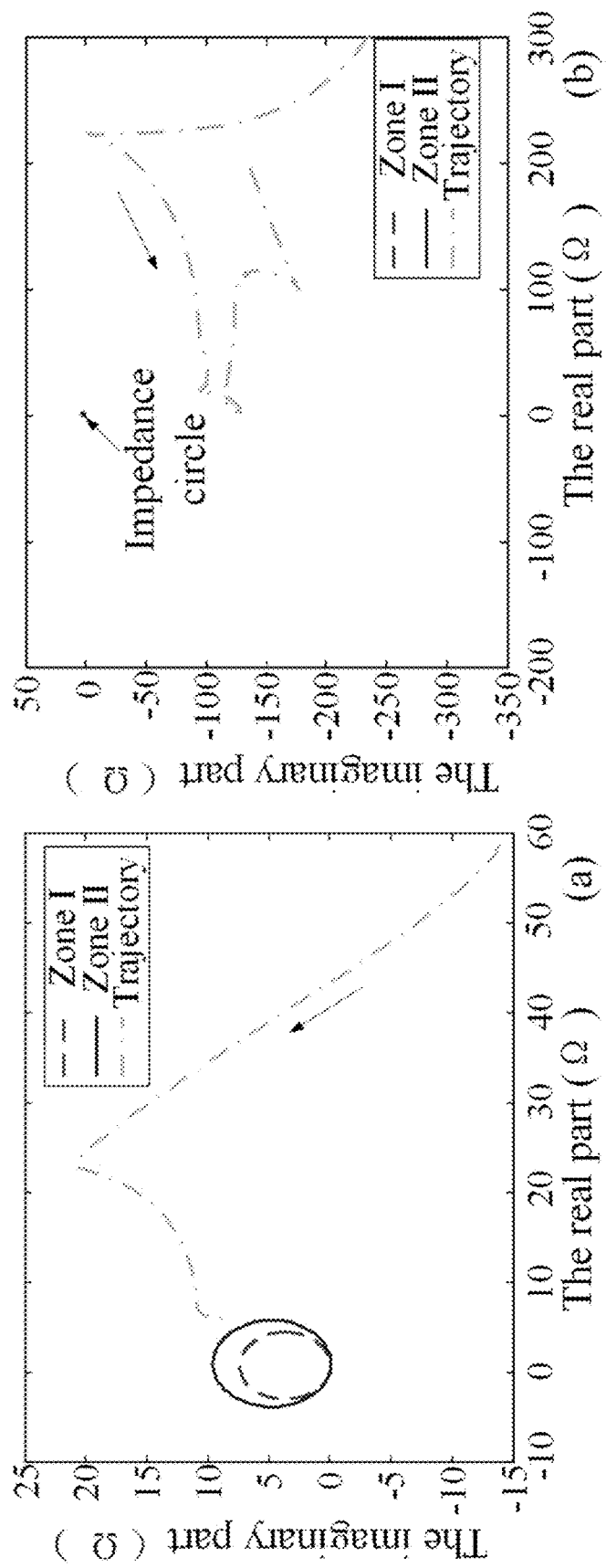
FIG. 21 shows example performance of conventional power frequency distance protection for real RES plants according to an embodiment of the present disclosure.

Field-testing data is derived from an example wind farm, and an example PV power plant. The schematic topological diagram of the example wind farm is substantially the same as the diagram 600 shown in FIG. 6, and it may comprise 66 PMSGs of the same type. A phase-C grounding fault occurs at the 220 kV transmission line, and the length of the transmission line is about 25.461 km. For the data in the example PV power plant, the example PV power plant is connected to a distribution network by a 35 kV special line. A phase-B-to-phase-C fault occurs at the PV side of the special line, and the length of the special line is about 3.924 km. FIG. 21 and Table 5 show the performance of conventional power frequency distance protection and power frequency variation component distance protection, respectively. In FIG. 21, the diagram 2105 shows the performance of conventional power frequency distance protection for the example wind farm, and the diagram 2110 show the performance of conventional power frequency distance protection for the example PV plant.

TABLE 5 performance of power frequency variation component distance protection

| Site | Zone I (kV) | Zone II (kV) | Fault point (kV) |
|---|---|---|---|
| Wind Farm | 52.5074 | 53.9626 | 127.0171 |
| PV Plant | 31.1131 | 31.1110 | 35 |

It can be seen from the diagram 1205 that the measurement trajectory is located outside the impedance circle of the zone I and zone II distance protection, so the distance protection will refuse to operate. However, it is close to the boundary of the impedance circle because the short-circuit current on the RES side is not much smaller than the one on the grid side due to the large zero-sequence current when a single-phase grounding fault occurs at the 220 kV transmission line. In addition, as can be seen from the diagram 1210 for a phase-to-phase fault, the measurement trajectory is significantly away from the impedance circle of the zone I and zone II, and the distance protection will refuse to operate because the fault current on the RES side is much smaller than the one on the grid side.

Figure 22:
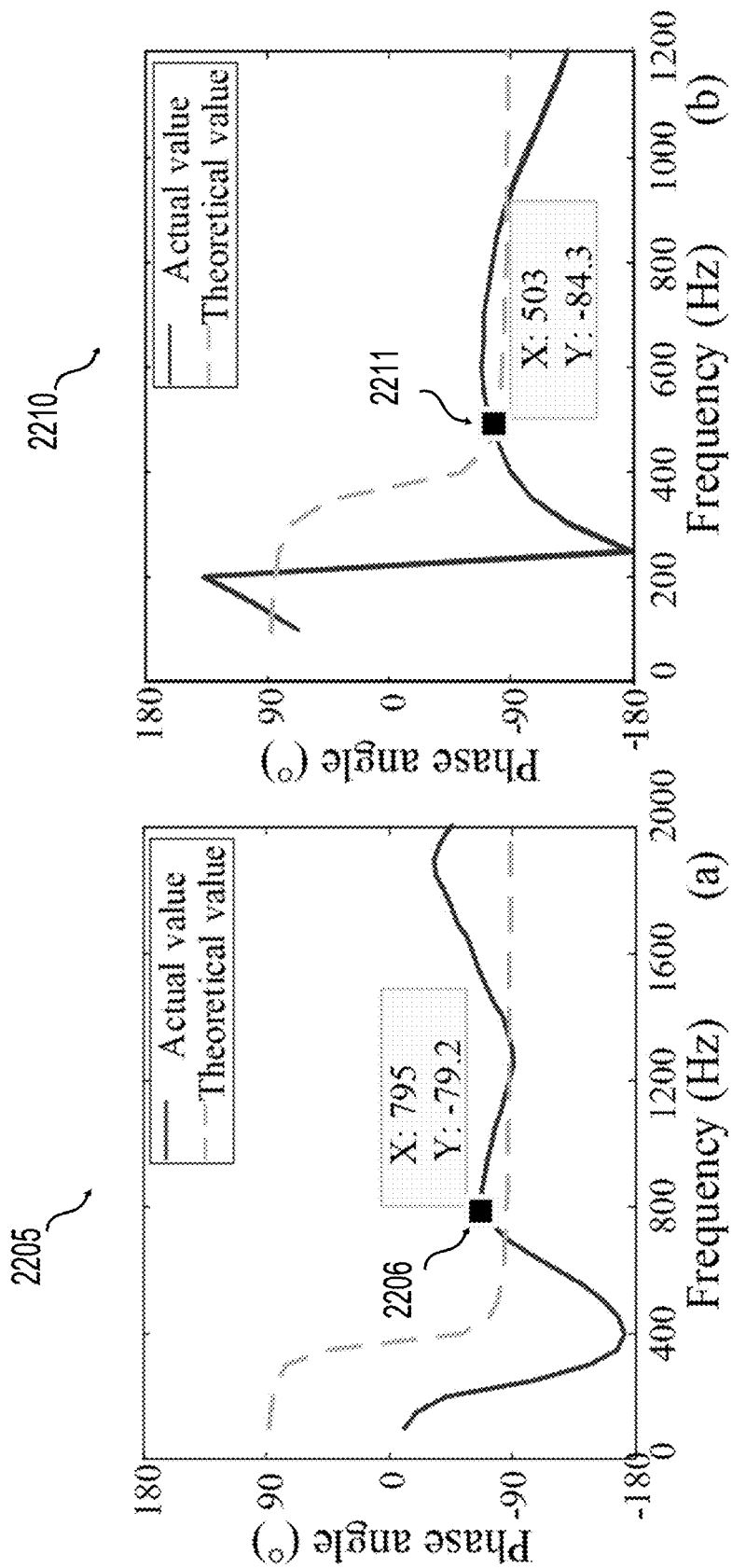
FIG. 22 shows equivalent impedance angles for real RES plants according to an embodiment of the present disclosure.

The parameters of LCL filter for the example wind farm and the example PV plant and both lower frequency limits are illustrated in Table 6. FIG. 22 show example equivalent impedance angles for the wind farm and the PV plant. It can be seen from the diagram 2205 that the high-frequency impedance angle of RESs is closest to −90° from a lower frequency limit 2206 to about 1.6 kHz for the data in the example wind farm, so this frequency range may be used as the one for studying the high-frequency fault component based distance protection disclosed herein. As shown in the diagram 2210, for the data in the example PV plant, the measured high-frequency impedance angle is closest to −90° in the frequency range from a lower frequency limit 2211 to about 1 kHz. Therefore, the performance of the disclosed distance protection may be studied in this frequency range. In the higher frequency range (e.g., above 1.6 kHz in the diagram 2205 and/or above 1 kHz in the diagram 2210), the data from both the wind farm and the PV plant deviate from −90° because their sampling frequency is only 5 kHz and 3.2 kHz, respectively. In addition, just one or several frequencies are used in actual engineering applications instead of a frequency range.

TABLE 6

| parameters of the LCL filter | | | | |
| --- | --- | --- | --- | --- |
| Site | L₁ (mH) | L₂ (mH) | C (μF) | Lower frequency (Hz) |
| Wind Farm | 2.5 | 1 | 160 | 795 |
| PV Plant | 4 | 1.5 | 250 | 503 |

Figure 23:
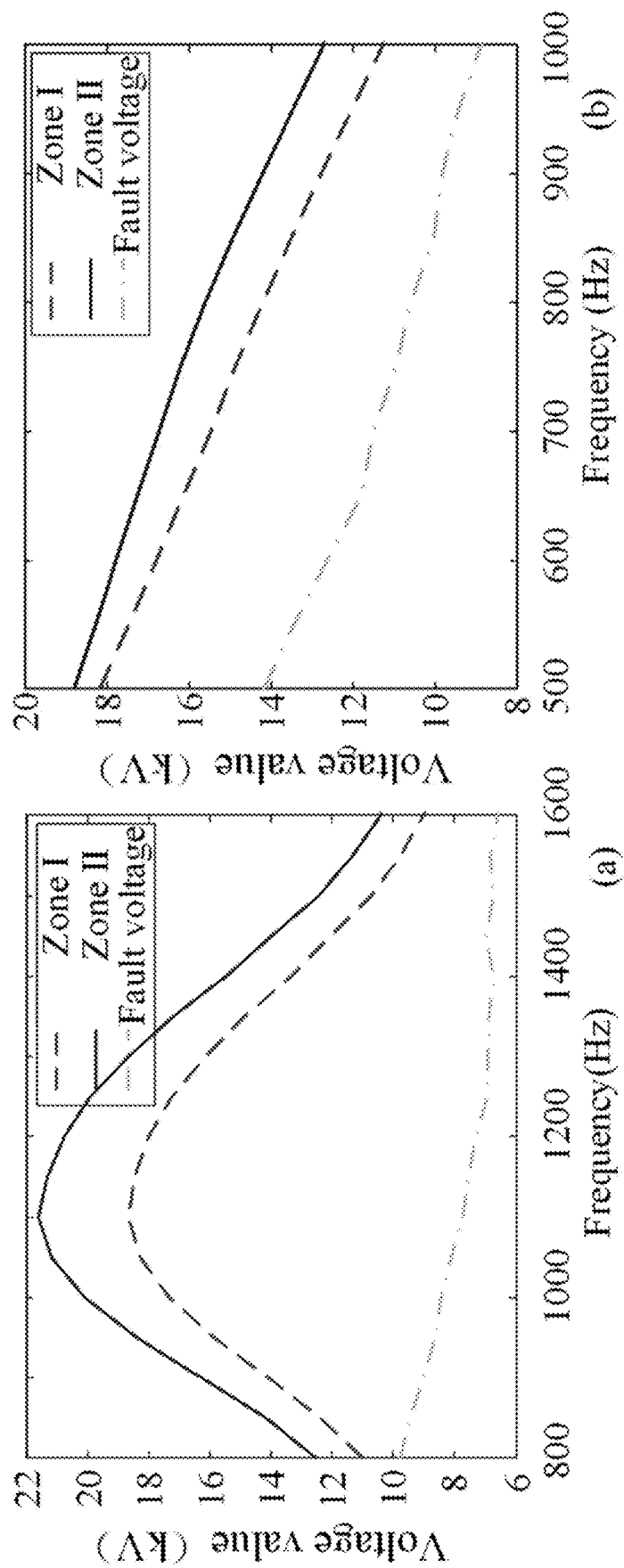
FIG. 23 shows example performance of the disclosed distance protection for real RES plants according to an embodiment of the present disclosure.

FIG. 23 shows the performance of the disclosed high-frequency fault component based distance protection method in the selected frequency ranges for the example wind farm and the example PV plant (i.e., from the lower frequency limit 2206 to about 1.6 kHz for the data in the example wind farm, and from the lower frequency limit 2211 to about 1 kHz for the data in the example PV plant). It can be known from FIG. 23 that the disclosed distance protection has good performance in the selected frequency ranges and that the zone I distance protection can operate correctly when the conventional power frequency distance protection and power frequency variation component distance protection refuse to operate.

RESs show fault characteristics like weak feed, current frequency offset and unstable internal impedance, so the conventional distance protection on the RES side poses a high risk of refusal. In order to solve this problem, a high-frequency fault component based distance protection is provided in this disclosure.

The high-frequency impedance model of RESs is established to solve the problem associated with the unstable internal impedance of RESs under power frequency. On this basis, internal and external faults of a transmission line can be reliably determined by comparing the high-frequency operating voltage with the high-frequency voltage at the fault point. The disclosed protection method can operate with a high speed, and is unaffected by control strategies and frequency offset because the selected frequency is higher than the bandwidth of the current loop and the rotor-speed frequency. The disclosed distance protection method is also capable of resisting the fault resistance due to the large impedance circle in the selected frequency range. In addition, the disclosed distance protection can tolerate noise with the SNR of 30 dB. These advantages render good performance for internal and external faults. The disclosed distance protection scheme is confirmed by RTDS hardware in loop experimental testing and using field-testing data.

VI. Technical Implementation of the Disclosed Method

Figure 24:
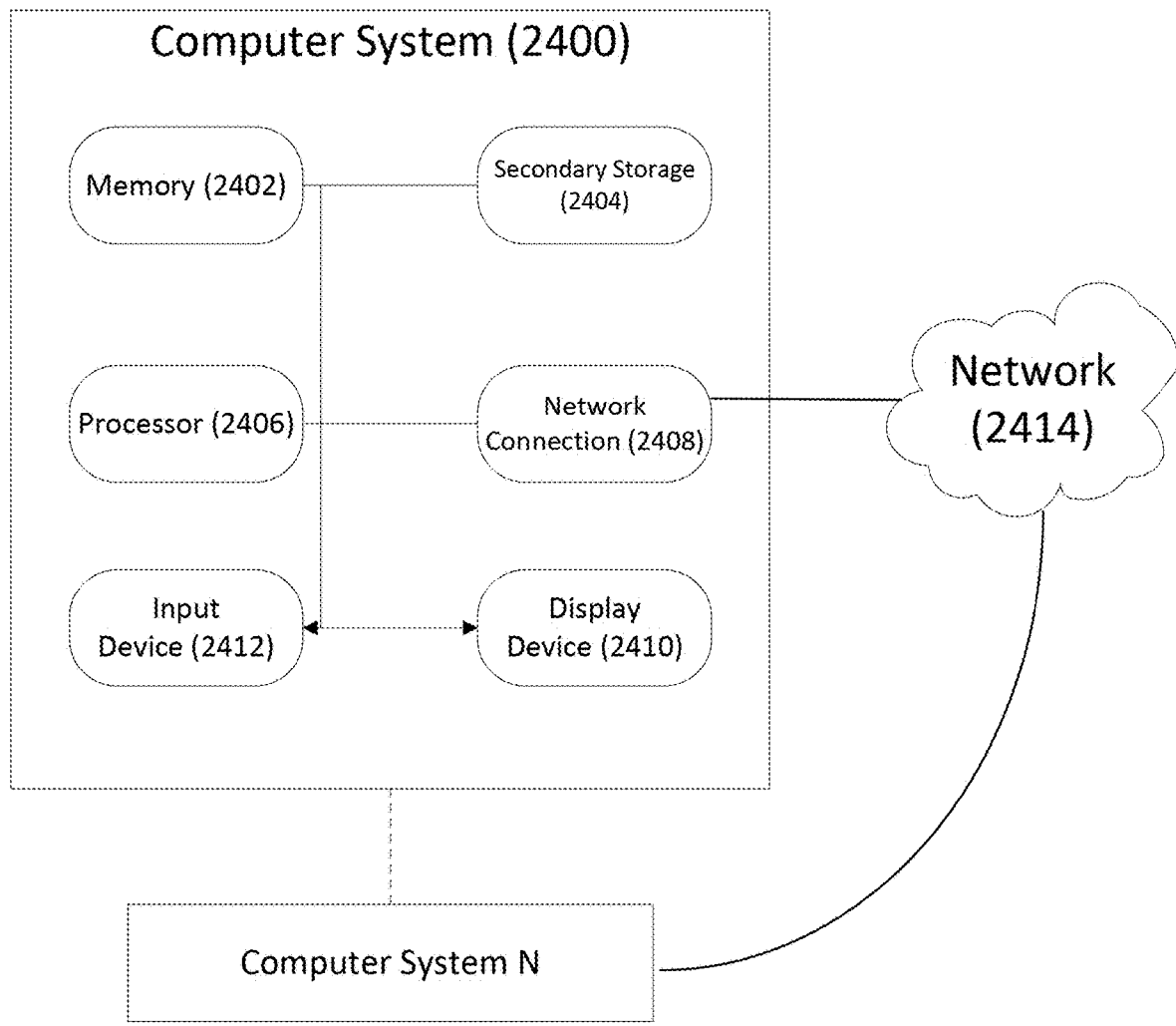
FIG. 24 shows a computer system that may implement a disclosed distance protection method according to an embodiment of the present disclosure.

In some embodiments, the protection system and method disclosed herein may comprise a computer system to implement the disclosed protection method. The computer system may act as a controller to control executions of, for example, the flow chart of the protection method 1000 in FIG. 10, the experimental test system 1100 in FIG. 11, and various other calculations and simulations disclosed herein. FIG. 24 illustrates an exemplary computer system 2400 that can be used to implement the disclosed method partially or wholly. The computer system 2400, or other computer systems similarly configured, may include and execute one or more subsystem components to perform functions described herein, including the steps/blocks of various flow processes, measurements and/or analyses described above. Likewise, a mobile device, a cell phone, a smartphone, a laptop, a desktop, a notebook, a tablet, a wearable device, a server, etc., which includes some of the same components of the computer system 2400, may run an application (or software) and perform the steps and functionalities described above. The computer system 2400 may connect to a network 2414, e.g., Internet, or other network, to receive inquiries, obtain data, and/or transmit information as described above.

The computer system 2400 typically includes a memory 2402, a secondary storage device 2404, and a processor 2406. The computer system 2400 may also include a plurality of processors 2406 and be configured as a plurality of, e.g., bladed servers, or other known server configurations. The computer system 2400 may also include a network connection device 2408, a display device 2410, and an input device 2412.

The memory 2402 may include RAM or similar types of memory, and it may store one or more applications for execution by the processor 2406. The secondary storage device 2404 may include a hard disk drive, floppy disk drive, CD-ROM drive, or other types of non-volatile data storage. The processor 2406 executes the application(s), such as those described herein, which are stored in the memory 2402 or secondary storage 2404, or received from the Internet or other network 2414. The processing by processor 2406 may be implemented in software, such as software modules, for execution by computers or other machines. These applications preferably include instructions executable to perform the system and subsystem component functions and methods described above and illustrated in the Figs. herein. The applications preferably provide graphical user interfaces (GUIs) through which users may view and interact with the subsystem components.

The computer system 2400 may store one or more database structures in the secondary storage 2404, for example, for storing and maintaining the information/data necessary to perform the above-described functions. Alternatively, such information/data may be in storage devices separate from these components.

Also, as noted, the processor 2406 may execute one or more software applications to provide the functions described in this specification, specifically to execute and perform the steps and functions in the process flows, measurements and/or analyses described above. The GUIs may be formatted, for example, as web pages in HyperText Markup Language (HTML), Extensible Markup Language (XML) or in any other suitable form for presentation on a display device depending upon applications used by users to interact with the computer system 2400.

The input device 2412 may include any device for entering information into the computer system 2400, such as a touch-screen, keyboard, mouse, cursor-control device, microphone, digital camera, video recorder or camcorder. The input and output device 2412 may be used to enter information into GUIs during performance of the methods described above. The display device 2410 may include any type of device for presenting visual information such as, for example, a computer monitor or flat-screen display (or mobile device screen). The display device 2410 may display the GUIs and/or output from sub-system components (or software).

Examples of the computer system 2400 include dedicated server computers, such as bladed servers, personal computers, laptop computers, notebook computers, palm top computers, network computers, mobile devices, or any processor-controlled device capable of executing a web browser or other type of application for interacting with the system.

Although only one computer system 2400 is shown in detail, the computer system 2400 may use multiple computer systems or servers as necessary or desired to support the users and may also use back-up or redundant servers to prevent network downtime in the event of a failure of a particular server. In addition, although the computer system 2400 is depicted with various components, one skilled in the art will appreciate that the computer system 2400 can contain additional or different components. In addition, although aspects of an implementation consistent with the above are described as being stored in a memory, one skilled in the art will appreciate that these aspects can also be stored on or read from other types of computer program products or computer-readable media, such as secondary storage devices, including hard disks, floppy disks, or CD-ROM; or other forms of RAM or ROM. The computer-readable media may include instructions for controlling the computer system 2400, to perform a particular method, such as methods described above.

Throughout the specification and the claims, the following terms take at least the meanings explicitly associated herein, unless the context clearly dictates otherwise. The term "or" is intended to mean an inclusive "or." Further, the terms "a," "an," and "the" are intended to mean one or more unless specified otherwise or clear from the context to be directed to a singular form.

In this description, numerous specific details have been set forth. It is to be understood, however, that implementations of the disclosed technology may be practiced without these specific details. In other instances, well-known methods, structures and techniques have not been shown in detail in order not to obscure an understanding of this description. References to "some examples," "other examples," "one example," "an example," "various examples," "one embodiment," "an embodiment," "some embodiments," "example embodiment," "various embodiments," "one implementation," "an implementation," "example implementation," "various implementations," "some implementations," etc., indicate that the implementation(s) of the disclosed technology so described may include a particular feature, structure, or characteristic, but not every implementation necessarily includes the particular feature, structure, or characteristic. Further, repeated use of the phrases "in one example," "in one embodiment," or "in one implementation" does not necessarily refer to the same example, embodiment, or implementation, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

While certain implementations of the disclosed technology have been described in connection with what is presently considered to be the most practical and various implementations, it is to be understood that the disclosed technology is not to be limited to the disclosed implementations, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain implementations of the disclosed technology, including the best mode, and also to enable any person skilled in the art to practice certain implementations of the disclosed technology, including making and using any devices or systems and performing any incorporated methods. The patentable scope of certain implementations of the disclosed technology is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims The present disclosure is not to be limited in terms of the particular embodiments described in this application, which are intended as illustrations of various aspects. Many modifications and variations can be made without departing from its spirit and scope, as may be apparent. Functionally equivalent methods and apparatuses within the scope of the disclosure, in addition to those enumerated herein, may be apparent from the foregoing representative descriptions. Such modifications and variations are intended to fall within the scope of the appended representative claims. The present disclosure is to be limited only by the terms of the appended representative claims, along with the full scope of equivalents to which such representative claims are entitled. It is also to be understood that the terminology used herein is for the purpose of describing particular embodiments only, and is not intended to be limiting.

What is claimed is:

1. A high-frequency fault component based distance protection system for a transmission line of a renewable energy source (RES) system, wherein the RES system comprises:
    a renewable energy source;
    a collector bus configured to connect the renewable energy source to a first end of the transmission line, a second end of the transmission line being connected to an alternating current (AC) power grid, wherein the second end of the transmission line is opposite to the first end of the transmission line;
    a protection relay device disposed between the renewable energy source and the collector bus with a proximity to the collector bus;
    a first circuit breakers disposed at the first end of the transmission line; and
    a second circuit breaker disposed at the second end of the transmission line;
    the high-frequency fault component based distance protection system comprising a controller in signal communication with the RES system, the controller configured to:
        sample output voltages and currents of the renewable energy source at the protection relay device;
        determine whether a fault occurs based on the output voltages and currents;
        when detecting the fault has occurred at a fault point, apply a wavelet transform to a portion of the output voltages and currents, the portion of the measured output voltages and currents being output voltages and currents within a time window of about 10 ms that includes about 5 ms prior to onset of the fault and about 5 ms after the onset of the fault;
        obtain, from the wavelet transform, high-frequency voltages and high-frequency currents in a selected high-frequency range, the selected high-frequency range having a lower frequency limit and an upper frequency limit of about 3 kHz, wherein high-frequency impedance phase angles of the renewable energy source are stable and are in phase with high-frequency impedance phase angles of the transmission line in the selected high-frequency range;
        determine a first protection high-frequency impedance value for a first protection distance of the transmission line in the selected high-frequency range, the first protection distance being a length of about 80% to about 85% of an entire length of the transmission line and measured from the first end of the transmission line to the second end of the transmission line;

determine a second protection high-frequency impedance value for a second protection distance of the transmission line in the selected high-frequency range, the second protection distance being a remaining length of the entire length of the transmission line;

determine a high-frequency line impedance from the fault point to the collector bus, and an equivalent high-frequency impedance of the renewable energy source in the selected high-frequency range;

construct a high-frequency fault voltage of the fault point in the selected high-frequency range based on the obtained high-frequency voltages and high-frequency currents at the protection relay device, the high-frequency line impedance from the fault point to the collector bus, and the equivalent high-frequency impedance of the renewable energy source;

determine a first high-frequency operating voltage for the first protection distance of the transmission line in the selected high-frequency range, based on the obtained high-frequency voltages and high-frequency currents at the protection relay device and the first protection high-frequency impedance value;

determine a second high-frequency operating voltage for the second protection distance of the transmission line protection in the selected high-frequency range, based on the obtained high-frequency voltages and high-frequency currents at the protection relay device) and the second protection high-frequency impedance value;

compare an amplitude of the high-frequency fault voltage of the fault point with an amplitude of the first high-frequency operating voltage;

in response to a determination that the amplitude of the first high-frequency operating voltage is greater than or equal to the amplitude of the high-frequency fault voltage of the fault point, identify the fault as an internal fault occurred in the first protection distance of the transmission line, and transmit a trigger signal to the first circuit breaker to cut off the fault;

in response to a determination that the amplitude of the first high-frequency operating voltage is less than the amplitude of the high-frequency fault voltage of the fault point, compare the amplitude of the high-frequency fault voltage of the fault point with an amplitude of the second high-frequency operating voltage;

in response to a determination that the amplitude of the second high-frequency operating voltage is less than the amplitude of the high-frequency fault voltage of the fault point, identify the fault as an external fault with respect to the transmission line;

in response to a determination that the amplitude of the second high-frequency operating voltage is greater than or equal to the amplitude of the high-frequency fault voltage of the fault point, execute a delay of a specified time period;

determine whether the fault is still present after the specified time period;

in response to a determination that the fault still exists, identify the fault as an internal fault occurred in the second protection distance of the transmission line, and transmit a trigger signal to the second circuit breaker to cut off the fault; and in response to a determination that the fault does not exist anymore, identify the fault as an external fault with respect to the transmission line.

2. A high-frequency fault component based distance protection method for a transmission line of a renewable energy source (RES) system, wherein the RES system comprises:

a renewable energy source;

a collector bus configured to connect the renewable energy source to a first end of the transmission line, a second end of the transmission line being connected to an alternating current (AC) power grid, wherein the second end of the transmission line is opposite to the first end of the transmission line;

a protection relay device disposed between the renewable energy source and the collector bus with a proximity to the collector bus;

a first circuit breakers disposed at the first end of the transmission line;

a second circuit breaker disposed at the second end of the transmission line; and a controller in signal communication with the RES system, the high-frequency fault component based distance protection method comprising:

sampling, by the controller, output voltages and currents of the renewable energy source at the protection relay device;

determining, by the controller, whether a fault occurs based on the output voltages and currents;

when detecting the fault has occurred at a fault point, applying, by the controller, a wavelet transform to a portion of the output voltages and currents, the portion of the measured output voltages and currents being output voltages and currents within a time window of about 10 ms that includes about 5 ms prior to onset of the fault and about 5 ms after the onset of the fault;

obtaining, by the controller from the wavelet transform, high-frequency voltages and high-frequency currents in a selected high-frequency range, the selected high-frequency range having a lower frequency limit and an upper frequency limit of about 3 kHz, wherein high-frequency impedance phase angles of the renewable energy source are stable and are in phase with high-frequency impedance phase angles of the transmission line in the selected high-frequency range;

determining, by the controller, a first protection high-frequency impedance value for a first protection distance of the transmission line in the selected high-frequency range, the first protection distance being a length of about 80% to about 85% of an entire length of the transmission line and measured from the first end of the transmission line to the second end of the transmission line;

determining, by the controller, a second protection high-frequency impedance value for a second protection distance of the transmission line in the selected high-frequency range, the second protection distance being a remaining length of the entire length of the transmission line;

determining, by the controller, a high-frequency line impedance from the fault point to the collector bus, and an equivalent high-frequency impedance of the renewable energy source in the selected high-frequency range;

constructing, by the controller, a high-frequency fault voltage of the fault point in the selected high-frequency range based on the obtained high-frequency voltages and high-frequency currents at the protection relay device, the high-frequency line impedance from the fault point to the collector bus, and the equivalent high-frequency impedance of the renewable energy source;

determining, by the controller, a first high-frequency operating voltage for the first protection distance of the transmission line in the selected high-frequency range, based on the obtained high-frequency voltages and high-frequency currents at the protection relay device and the first protection high-frequency impedance value;

determining, by the controller, a second high-frequency operating voltage for the second protection distance of the transmission line protection in the selected high-frequency range, based on the obtained high-frequency voltages and high-frequency currents at the protection relay device) and the second protection high-frequency impedance value;

comparing, by the controller, an amplitude of the high-frequency fault voltage of the fault point with an amplitude of the first high-frequency operating voltage;

in response to a determination that the amplitude of the first high-frequency operating voltage is greater than or equal to the amplitude of the high-frequency fault voltage of the fault point, identifying, by the controller, the fault as an internal fault occurred in the first protection distance of the transmission line, and transmitting, by the controller, a trigger signal to the first circuit breaker to cut off the fault;

in response to a determination that the amplitude of the first high-frequency operating voltage is less than the amplitude of the high-frequency fault voltage of the fault point, comparing, by the controller, the amplitude of the high-frequency fault voltage of the fault point with an amplitude of the second high-frequency operating voltage;

in response to a determination that the amplitude of the second high-frequency operating voltage is less than the amplitude of the high-frequency fault voltage of the fault point, identifying, by the controller, the fault as an external fault with respect to the transmission line;

in response to a determination that the amplitude of the second high-frequency operating voltage is greater than or equal to the amplitude of the high-frequency fault voltage of the fault point, executing, by the controller, a delay of a specified time period;

determining, by the controller, whether the fault is still present after the specified time period;

in response to a determination that the fault still exists, identifying, by the controller, the fault as an internal fault occurred in the second protection distance of the transmission line, and transmitting, by the controller, a trigger signal to the second circuit breaker to cut off the fault; and in response to a determination that the fault does not exist anymore, identifying, by the controller, the fault as an external fault with respect to the transmission line.

* * * * *